(12) United States Patent
Le Royer et al.

(10) Patent No.: US 9,099,555 B2
(45) Date of Patent: Aug. 4, 2015

(54) TUNNEL FIELD EFFECT TRANSISTOR

(71) Applicant: Commissariat á l'énergie atomique et aux énergies alternatives, Paris (FR)

(72) Inventors: Cyrille Le Royer, Tullins-Fures (FR); Costin Anghel, Vanves (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 143 days.

(21) Appl. No.: 13/925,119

(22) Filed: Jun. 24, 2013

(65) Prior Publication Data

US 2014/0035040 A1 Feb. 6, 2014

(30) Foreign Application Priority Data

Jun. 25, 2012 (FR) ..................................... 12 55979

(51) Int. Cl.
| | |
|---|---|
| H01L 29/06 | (2006.01) |
| H01L 29/78 | (2006.01) |
| H01L 29/66 | (2006.01) |
| H01L 29/739 | (2006.01) |
| H01L 29/08 | (2006.01) |
| H01L 29/51 | (2006.01) |
| H01L 29/165 | (2006.01) |

(52) U.S. Cl.
CPC ........ *H01L 29/7831* (2013.01); *H01L 29/0843* (2013.01); *H01L 29/0847* (2013.01); *H01L 29/66356* (2013.01); *H01L 29/7391* (2013.01); *H01L 29/165* (2013.01); *H01L 29/517* (2013.01)

(58) Field of Classification Search
CPC . H01L 29/06; H01L 29/0615; H01L 29/6659; H01L 29/7311
See application file for complete search history.

(56) References Cited

U.S. PATENT DOCUMENTS 8,138,547 B2 * 3/2012 Guo et al. ..................... 257/347
2013/0069111 A1 * 3/2013 Flachowsky et al. ......... 257/192

OTHER PUBLICATIONS

Search Report and Written Opinion as issued for French Patent Application No. 1255979, dated May 2, 2013.
Villalon, A., et al., "Strained Tunnel FETs with record $I_{on}$: First demonstration of ETSOI TFETs with SiGe channel and RSD," Symposium on VLSI Technology Digest of Technical Papers, 2012, pp. 49-50.

(Continued)

*Primary Examiner* — Jae Lee
(74) *Attorney, Agent, or Firm* — Pillsbury Winthrop Shaw Pittman LLP

(57) ABSTRACT

A TFET transistor includes an intrinsic channel, source and drain extension regions, source and drain conductive regions, a gate surmounting the channel and laid out such that an end of the channel is not covered by the gate. The transistor includes a first arrangement for forming an isolating space between the sides of the gate and the source conductive region including a first and a second dielectric spacer. The extension region has a thickness strictly greater than that of the channel such that the extension region has an increased thickness opposite the gate dielectric layer. The first face of the first spacer is in contact with the side of the gate followed by the side of the gate dielectric layer such that the first face covers the whole of the side of the layer.

10 Claims, 17 Drawing Sheets

(56) References Cited

OTHER PUBLICATIONS

Le Royer, et al., "First Demonstration of Ultrathin Body c-SiGe Channel FDSOI pMOSFETs combined with *SiGe(:B)* RSD: Drastic Improvement of Electrostatics ($V_{th,p}$ tuning, DIBL) and Transport ($\mu_0$, $I_{sat}$) Properties down to 23nm Gate Length," IEEE International Electron Devices Meeting, Technical Digest, Dec. 5, 2011, pp. 394-397.

Mayer, F., et al., "Impact of SOI, $Si_{1-x}Ge_xOI$ and GeOI substrates on CMOS compatible Tunnel FET performance," Technical Digest,International Electron Devices Meeting, 2008, 4 pgs.

Nakahara, Y., et al., "Ultra-shallow in-situ-doped raised source/drain structure for sub-tenth micron CMOS," Symposium on VLSI Technology Digest of Technical Papers, 1996, pp. 174-175.

Sun, J., et al., "Impact of Epi Facets on Deep Submicron Elevated Source/Drain MOSFET Characteristics," IEEE Transactions on Electron Devices, vol. 45, No. 6, Jun. 1998, pp. 1377-1380.

Anghel, C., et al., "Tunnel field effect transistor with increased on current, low-k spacer and high-k dielectric," Applied Physics Letters, American Institute of Physics, vol. 96, 2010, 3 pgs.

\* cited by examiner

TUNNEL FIELD EFFECT TRANSISTOR

CROSS-REFERENCE TO RELATED APPLICATIONS

This application is based upon and claims the benefit of priority from French Patent Application No. 1255979, filed Jun. 25, 2012, the entire content of which is incorporated herein by reference.

The present invention relates to the field of microelectronics and more particularly relates to a tunnel field effect transistor.

Generally speaking, tunnel field effect transistors (TFET) are increasingly envisaged to replace CMOS type transistors, particularly for low power applications. Tunnel field effect transistors (also known as tunnel junction transistors) are gate PiN diodes where the current in the passive state comes from carriers going from band to band by tunnel effect. They are interesting devices for low power consumption applications. TFET transistors have in fact very low leakage currents $I_{off}$ (current in the blocked state of the transistor) as well as high sub-threshold slopes compared to CMOS transistors of similar dimensions. An example of structure of a double gate N-type TFET transistor 1 is illustrated in FIG. 1. The TFET 1 is based on a PiN diode architecture with one gate and comprises:
- a p+ doped source semi-conductive zone 2;
- a central intrinsic channel semi-conductive zone 3;
- an n+ doped drain semi-conductive zone 4;
- two gate zones 5 and 6, for example metal, above and below the intrinsic zone 3 and separated therefrom by a gate dielectric layer (respectively 7 and 8).

The dielectric material of the gate dielectric layer is most often a material with high dielectric constant, known as "high-k" material; such a material makes it possible particularly to obtain better conduction currents.

On either side of the source zone 2 are found source conductive zones 9 and 10 (for example made of NiSi) formed for example by silicidation.

In the same way, on either side of the drain zone 4 are found drain conductive zones 11 and 12 (for example made of NiSi) formed for example by silicidation.

The source conductive zones 9 and 10 are respectively isolated from the gate zones 5 and 6 (and the associated dielectric layer thereof) by spacers 13 and 14.

The drain conductive zones 11 and 12 are respectively isolated from the gate zones 5 and 6 (and the associated dielectric layer thereof) by spacers 15 and 16.

FIG. 2 illustrates the band diagrams of the device 1 as a function of the position along the device 1 and according to the voltages applied to the gate, to the drain and to the source.

The operating principle is the following: by applying a positive voltage at the level of the drain (here VD=1V), the PiN diode is reverse biased thereby creating a potential barrier such that a very weak current $I_{off}$ in blocked mode is obtained. By applying a positive gate voltage (here VG=1.6V), the probability of tunnel transition is increased on the side of the source by bringing closer the valence and conduction bands. The transport is then assured by the source/drain electric field.

As mentioned above, one of the advantages of the TFET transistor is that it offers a very low leakage current $I_{off}$ compared to a CMOS transistor (and thus reduced dissipated power in blocked mode).

One of the major problems of TFET transistors nevertheless resides in the low intensity of conduction current $I_{on}$ (i.e. on state current of the transistor) compared to the $I_{on}$ values obtained for CMOS transistors of similar dimensions.

A known solution to this problem is disclosed in the document "Tunnel field effect transistor with increased ON current, low-k spacer and high-k dielectric" (Anghel et al., Applied Physics Letters 96, 122104 (2010)). This solution consists in replacing the high-k materials of the spacers 13, 14, 15 and 16 by materials with lower dielectric constant, known as low-k materials. The fact of using a high-k material for the gate dielectric material and a low-k material for the spacers makes it possible to increase substantially the conduction current $I_{on}$ and the sub-threshold slope.

A second known solution to this problem is disclosed in the document "Impact of SOI, $Si_{1-x}Ge_xOI$ and GeOI substrates on CMOS compatible Tunnel FET performance" (Mayer et al.—Tech. Dig.-Int. Electron Devices Meet.—2008). FIG. 3 illustrates a structure of TFET transistor 20 conforming to this document. The transistor 20 is a single gate transistor. It is formed on an SOI (Silicon On Insulator) type substrate 21 and comprises:
- a p+ doped source semi-conductive zone 22;
- a central intrinsic channel semi-conductive zone 23;
- an n+ doped drain semi-conductive zone 24;
- a gate zone 25 surmounting the intrinsic zone 23 and separated therefrom by a gate dielectric layer 26.

The source semi-conductive zone 22 is isolated from the gate zone 25 by a first and a second spacer 27 and 28. The first spacer 27 extends over a length (measured along the longitudinal direction of the channel of the transistor) of around 10 nm whereas the second spacer 28 extends over a length of 15 or 30 nm. The first spacer 27 is localised over the whole height of the gate zone 25 and stops at the upper surface of the gate dielectric layer 26. The second spacer 28 is localised on the source side between the first spacer 27 and the source zone 22 over a part of the height of the gate zone 25. The transistor 20 has a higher current $I_{on}$ for a length of the second spacer 28 equal to 30 nm than for a length of 15 nm.

Despite the aforementioned results, tunnel field effect transistors continue to have insufficient conduction currents $I_{on}$.

In this context, the aim of the present invention is to provide a tunnel field effect transistor having improved characteristics particularly in terms of conduction current and sub-threshold slope.

To this end, the aim of the present invention is to provide a tunnel field effect transistor comprising:
- a channel made of an intrinsic semi-conductor material;
- source and drain extension regions on either side of said channel, in contact with the intrinsic semi-conductor material of said channel, said source extension region being made of a semi-conductor material doped according to a first type of P or N doping and said drain extension region being made of a semi-conductor material doped according to a second type of doping opposite to said first type of doping;
- source and drain conductive regions respectively in contact with the source and drain extension regions and extending respectively above the source and drain extension regions;
- a gate structure surmounting said channel and laid out such that an end of said channel is not covered by the gate structure on the side of the source extension region, said gate structure comprising:
  - a gate dielectric layer in contact with said channel;
  - a gate zone above said gate dielectric layer such that said gate dielectric layer is arranged between said gate zone and said channel;

means for forming a drain isolating space between the respective sides of said gate structure and said drain conductive region opposite each other;

means for forming a source isolating space between the respective sides of said gate structure and said source conductive region opposite each other, said means comprising a first and a second dielectric spacer each having a first and a second lateral face;

said transistor being characterised in that:

said source extension region has a thickness strictly greater than that of the channel such that said source extension region has an increased thickness opposite said gate dielectric layer;

the first face of said first spacer is in contact with the side of said gate zone followed by the side of said gate dielectric layer such that said first face covers the whole of the side of said dielectric layer;

the second face of said first spacer is in contact with the first face of said second spacer and extends along the side of the increased thickness of the source extension region;

the first spacer covers the upper surface of the end of said channel not covered by the gate structure and has a length strictly below 5 nm, said length being measured along the longitudinal direction of said channel.

Thanks to the invention, the fact of using a P-doped source extension zone (case of an N-type TFET) or N-doped (case of a P-type TFET) having a greater thickness than that of the channel combined with the use of a first spacer having a short length (i.e. less than 5 nm) between the increased thickness of the source extension zone and the gate dielectric make it possible to increase considerably the conduction current $I_{on}$ and to have improved sub-threshold performances. The applicant has thus noted that the presence of the above characteristics makes it possible to limit depletion at the level of the interface between the channel and the source extension zone and thus to increase the conduction current. The fact that the second spacer covers the end of the channel of the source side while hugging the side of the gate dielectric layer makes it possible to avoid having a contact between the source extension region and the gate dielectric layer. The latter being most usually made of a material with high dielectric constant (high-k), the contact of the source extension region with a high-k material leads to an important depletion of the source extension region being avoided thanks to the present invention. In this sense, the transistor according to the invention has two major differences with the document "Impact of SOI, $Si_{1-x}Ge_xOI$ and GeOI substrates on CMOS compatible Tunnel FET performance" (F. Mayer et al.—Tech. Dig.-Int. Electron Devices Meet.—2008) identified above: the device described in this document comprises in fact a first spacer of which the thickness is of the order of 10 nm, thus much higher than the thickness of the first spacer according to the invention; moreover, said first spacer does not cover the lateral part of the gate dielectric layer. It is precisely these two characteristics that make it possible to obtain the desired technical effect leading to a large increase in conduction current. As regards the document "Tunnel field effect transistor with increased ON current, low-k spacer and high-k dielectric" (Anghel et al., Applied Physics Letters 96, 122104 (2010)), the latter describes a single spacer of high thickness (around 20 nm) with a source extension zone thickness identical to that of the channel.

The transistor according to the invention may also have one or more of the characteristics below, considered individually or according to any technically possible combination thereof:

according to a particularly advantageous embodiment, said first spacer is made of a low-k dielectric material and said gate dielectric layer is made of a high-k material; high-k material or dielectric material with high dielectric constant is taken to mean a material having a dielectric constant k strictly greater than 3.9 (dielectric constant of silicon oxide);

preferentially, said second spacer is made of a low-k dielectric material; low-k material or dielectric material with low dielectric constant is taken to mean a material having a dielectric constant k less than or equal to 3.9;

the length of said first spacer is comprised between 1 and 4 nm;

in a particularly advantageous manner, the length of said first spacer is comprised between 1 and 2 nm;

according to a preferential embodiment, said increased thickness of said source extension region is substantially equal to the thickness of the gate dielectric layer;

said channel and said drain extension region have the same thickness;

said drain conductive region fully covers the drain extension region;

said means for forming a drain isolating space between the respective sides of said gate structure and said drain conductive region opposite each other are in contact with said channel and extend above the end of said channel on the side of the drain extension region;

the second face of said second spacer is in contact with the side of the source conductive region;

said transistor is a double gate transistor having a symmetrical structure above and below said channel extended on either side by the source and drain extension regions, said transistor comprising:

second source and drain conductive regions respectively in contact with the source and drain extension regions and extending respectively below the source and drain extension regions;

a second gate structure below said channel and laid out such that an end of said channel is not covered by the second gate structure on the side of the source extension region, said second gate structure comprising:

a gate dielectric layer in contact with said channel;

a gate zone below said gate dielectric layer such that said gate dielectric layer is arranged between said gate zone and said channel;

means for forming a drain isolating space between the respective sides of said second gate structure and said second drain conductive region opposite each other;

means for forming a source isolating space between the respective sides of said second gate structure and said second source conductive region opposite each other, said means comprising a first and a second lower dielectric spacer each having a first and a second lateral face;

said source extension region having a second increased thickness opposite said gate dielectric layer of said second gate structure, the first face of said first lower spacer being in contact with the side of said gate zone followed by the side of said gate dielectric layer of said second gate structure such that said first face covers the whole of the side of said dielectric layer, the second face of said first lower spacer being in contact with the first face of said second lower spacer and extends along the side of said second increased thickness of the source extension region, the first lower spacer covering the lower surface of the end of said channel not covered by the second gate structure and having a length strictly below 5 nm, said length being measured along the longitudinal direction of said channel.

Other characteristics and advantages of the invention will become clearer from the description that is given below by way of indication and in no way limiting, while referring to the appended figures, among which:

In all the figures, common elements bear the same reference numbers. For reasons of clarity, only elements useful for the understanding of the invention have been represented, without respect for scale and in a schematic manner.

FIG. 4 represents schematically the structure of a single gate tunnel field effect TFET transistor 100 according to the invention.

Figure 1:
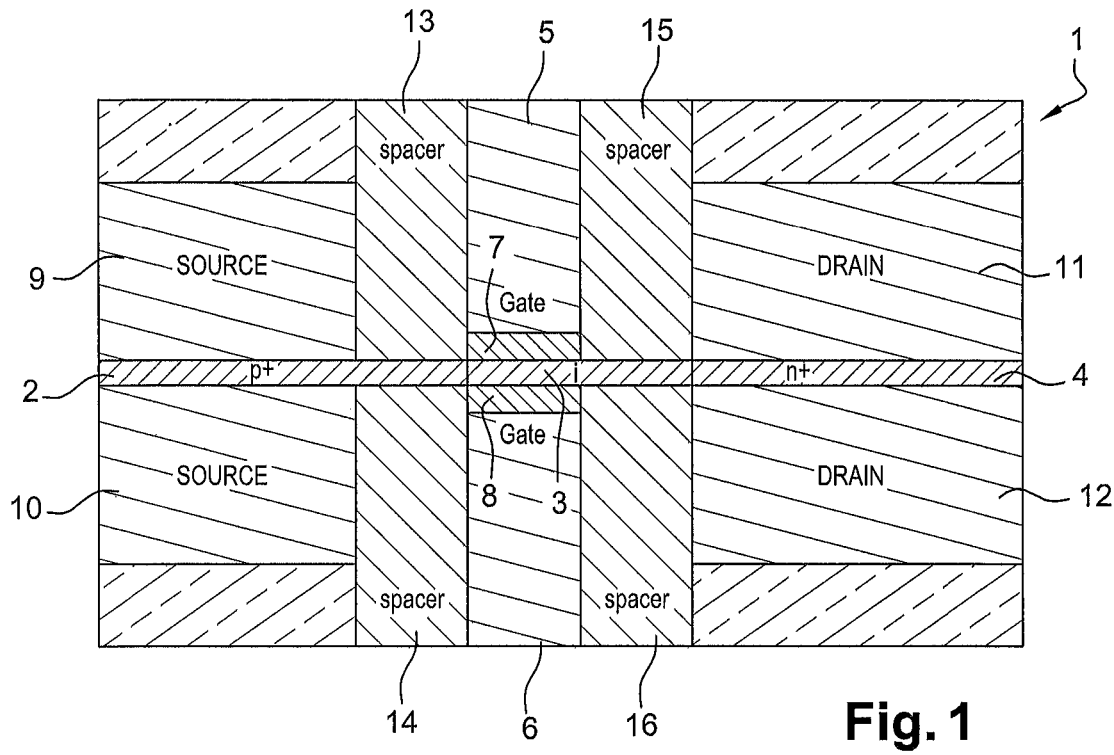
FIG. 1 illustrates an example of structure of a TFET transistor according to the prior art.
Figure 2:
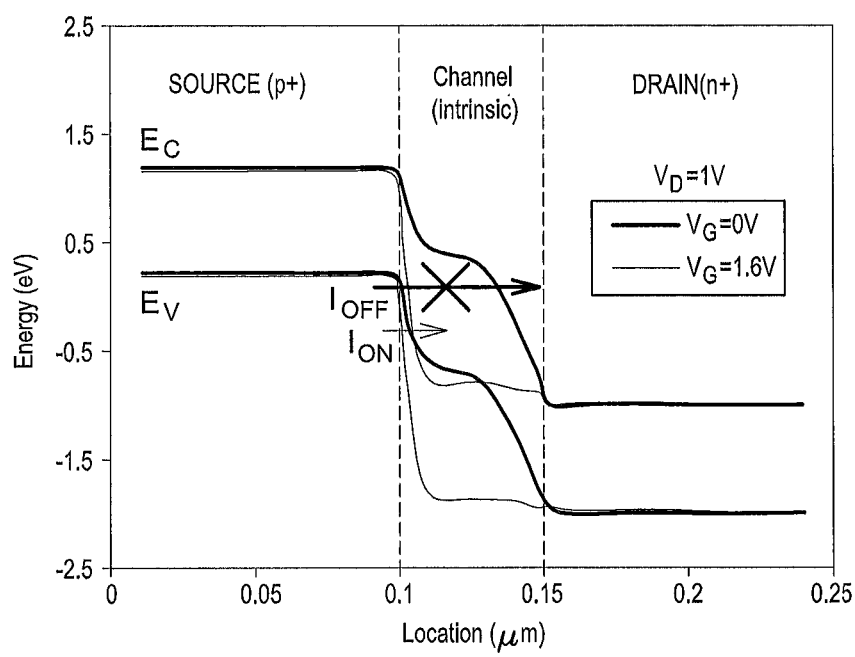
FIG. 2 represents the band diagram of the transistor of FIG. 1.
Figure 3:
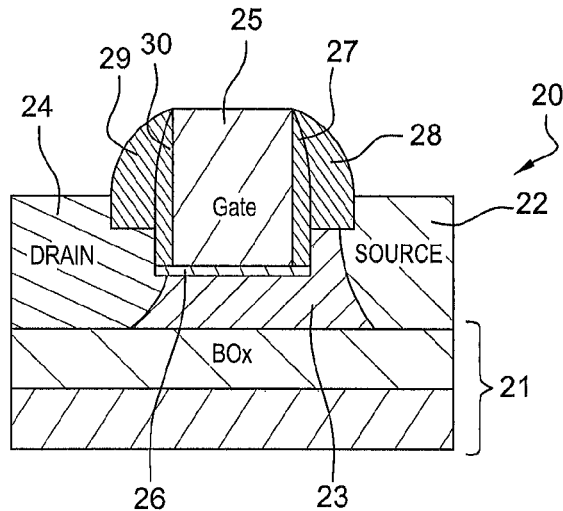
FIG. 3 illustrates a second example of TFET transistor structure according to the prior art.

The tunnel field effect transistor 100 is here an N-type transistor comprising a PiN diode architecture formed on a substrate 119 (for example a substrate of silicon on insulator type) including:
  a central channel 101 made of an intrinsic semiconductor material (for example silicon); intrinsic semiconductor material is taken to mean a semiconductor material in which the electrical behaviour only depends on the structure thereof, and not the addition of doping impurities;
  a source extension region 102 extending the channel 101 to one of the ends thereof and made of a P-doped semiconductor material of P+ type (for example B-doped Si);
  a drain extension region 103 extending the channel 101 to the other of the ends thereof and made of a highly N-doped semiconductor material of N+ type (for example P-doped Si).

As will be detailed hereafter, the thickness $t_S$ of the source extension region 102 is greater than the thickness $t_{Si}$ of the channel 101; thickness is taken to mean the dimension measured along the direction perpendicular to the substrates.

The transistor 100 comprises:
  a gate structure 106 comprising:
    a gate dielectric layer 108; the material of the dielectric layer 108 is preferentially a dielectric material of high-k type such as $HfO_2$;
    a gate conductive zone 107 above the gate dielectric layer 108 and in contact therewith; the material of the gate conductive zone 108 is for example a metal;
  a source conductive region 104;
  a drain conductive region 105;
  means 110 for forming a drain isolating space between the sides opposite each other of the gate structure 106 and the drain conductive region 105;
  means 111 for forming a source isolating space between the sides opposite each other of the gate structure 106 and the source conductive region 104.

The means 110 for forming a drain isolating space comprise:
  a first spacer 125 having a first lateral face 121 and a second lateral face 122;
  a second spacer 126 having a first lateral face 123 and a second lateral face 124.

In the same way, the means 111 for forming a source isolating space comprise:
  a first spacer 112 having a first lateral face 116 and a second lateral face 115;
  a second spacer 113 having a first lateral face 114 and a second lateral face 117.

All of the spacers are preferentially made of a low-k dielectric material such as $SiO_2$.

The transistor 100 comes in the form of a series of successive elements situated above the assembly formed by the channel 101 surrounded by extension regions 102 and 103, in the longitudinal direction of the channel from the source extension region (marked by the arrow 120):
  the source conductive region 104;
  the second spacer 113 of the means 111 forming a source isolating space;
  the first spacer 112 of the means 111 forming a source isolating space;
  the gate structure 106;
  the first spacer 125 of the means 110 forming a drain isolating space;
  the second spacer 126 of the means 110 forming a drain isolating space;
  the drain conductive region 105.

The layout of this series of successive elements will be detailed hereafter.

The source conductive region 104 surmounts the source extension region 102 and is in contact therewith on the first part of the length thereof. This source conductive region 104 is for example a metal region obtained by silicidation.

The second spacer 113 of the means 111 forming a source isolating space surmounts the source extension region 102 and is in contact therewith on the part of the length thereof not covered by the source conductive region (i.e. up to the interface with the channel 101). The second lateral face 117 of the second spacer 113 of the means 111 forming a source isolating space is in contact with the side of the source conductive region 104 opposite said second face. The role of the second spacer 113 is to ensure the electrostatic isolation between the source conductive region 104 and the gate zone 106.

The first spacer 112 of the means 111 forming a source isolating space has a length l (calculated along the longitudinal direction of the channel marked by the arrow 120) strictly below 5 nm, in a particularly advantageous manner comprised between 1 and 2 nm. The first spacer 112 surmounts the end 109 of the channel 101 and is in contact with said end over said length l. The second lateral face 115 of the first spacer 112 is in direct contact with the first lateral face 114 of the second spacer 113.

The gate structure 106 surmounts the channel 101 over a length L1 and is laid out such that the channel 101 has a free end of length l (covered by the first spacer 112 as mentioned above).

It will be noted that the dielectric layer 108 and the gate zone 107 have lateral sides substantially aligned (i.e. have an identical length L1 along the direction 120). The first lateral face 116 of the first spacer 112 of the means 111 forming a source isolating space is in direct contact with the sides of the dielectric layer 108 and the gate zone 107 opposite. It should be noted that the first lateral face 116 of the first spacer 112 covers the side of the dielectric layer 108 over the whole thickness tOx thereof. As evoked above, the thickness tS of the source extension region 102 is greater than the thickness tSi of the channel 101; in a particularly advantageous manner, the source extension region 102 has an increased thickness 118 equal to the thickness tOx of the dielectric layer 108 such that the upper surfaces of the source extension region 102 and the gate dielectric layer 108 are aligned. In other words, the total thickness tS of the source extension region, 102 is equal to the sum of the thickness tSi of the channel 101 and the thickness tOx of the gate dielectric layer 108. Thus, the first spacer 112 is used to separate the gate dielectric layer 108 from the increased thickness 118 of the source extension region 102. As will be seen hereafter, the increased thickness 118 makes it possible to avoid depletion of the source extension region 102 caused by the gate zone 106.

The gate dielectric layer 108 is arranged between the gate zone 107 and the channel 101 and is made preferentially of a high-k type material such as $HfO_2$. In the extension of the first spacer 112, the dielectric layer surmounts the channel 101 and is in contact with the latter over the whole length L1 thereof (corresponding to a part of the total length L2 of the channel).

The first lateral face 121 of the first spacer 125 of the means 110 forming a drain isolating space is in direct contact with the sides of the dielectric layer 108 and the gate zone 107 opposite. As previously in the case of the source spacers, the first lateral face 121 of the first spacer 125 covers the side of the dielectric layer 108 over the whole thickness tOx thereof.

The second lateral face 122 of the first spacer 125 of the means 110 forming a drain isolating space is in direct contact with the first lateral face 123 of the second spacer 126 of the means 110 forming a drain isolating space.

The first and second spacers 125 and 126 of the means 110 forming a drain isolating space surmount the channel 101 and are in contact therewith over the whole remaining length corresponding to L2-L1 not covered by the gate dielectric layer 108 and the first spacer 112.

One then passes to the region situated above the drain extension region 103.

The drain conductive region 105 surmounts the drain extension region 103 and is in contact therewith over the whole length thereof. This drain conductive region 105 is for example a metal region obtained by silicidation.

The second lateral face 124 of the second spacer 126 of the means 110 forming a drain isolating space is in contact with the side of the drain conductive region 105 opposite said second face 124.

It will be observed that an asymmetry has been introduced between the source and the drain to reduce the ambipolar character of the transistor 100. Thus, the gate zone 106 only covers a part of the channel 101 from the source extension region 102 whereas the remainder of the channel 101 on the side of the drain extension region 103 is not covered by the gate zone 106.

Figure 5:
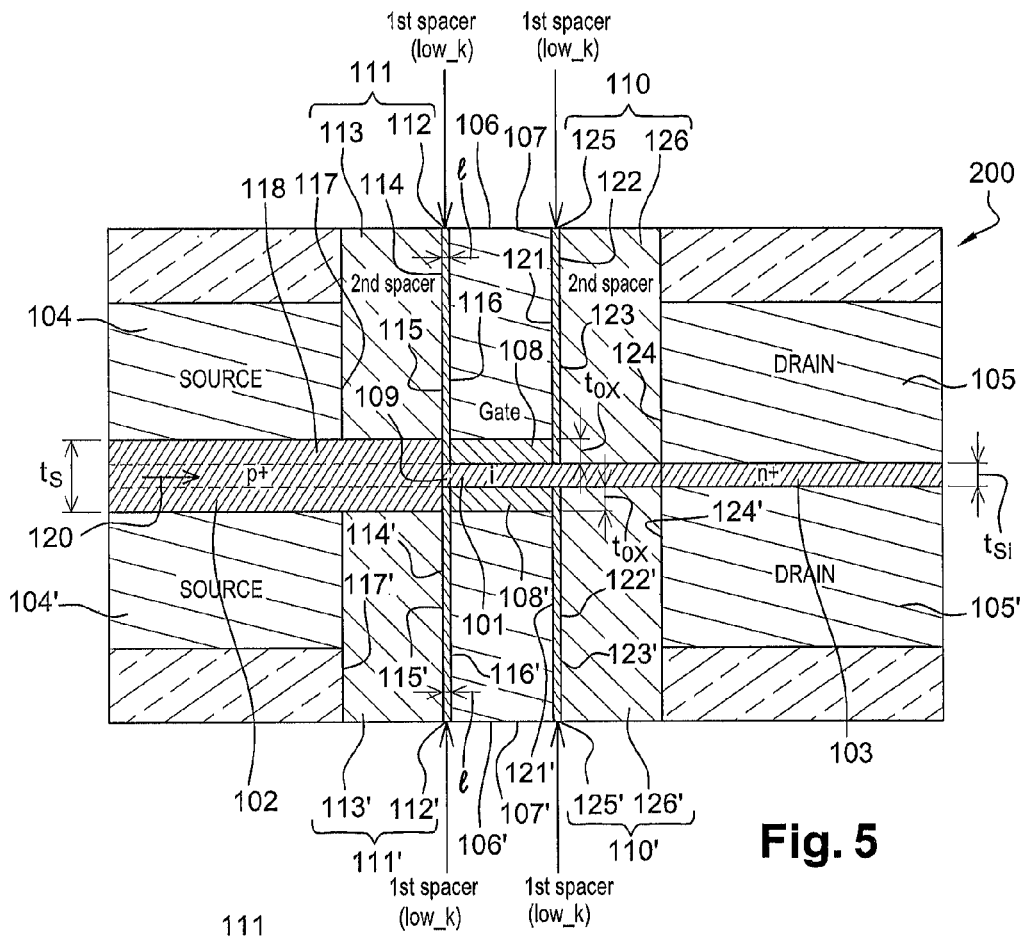
FIG. 5 represents the structure of a double gate tunnel field effect transistor according to the invention.

FIG. 5 represents schematically the structure of a double gate tunnel effect TFET transistor 200 according to the invention.

Figure 4:
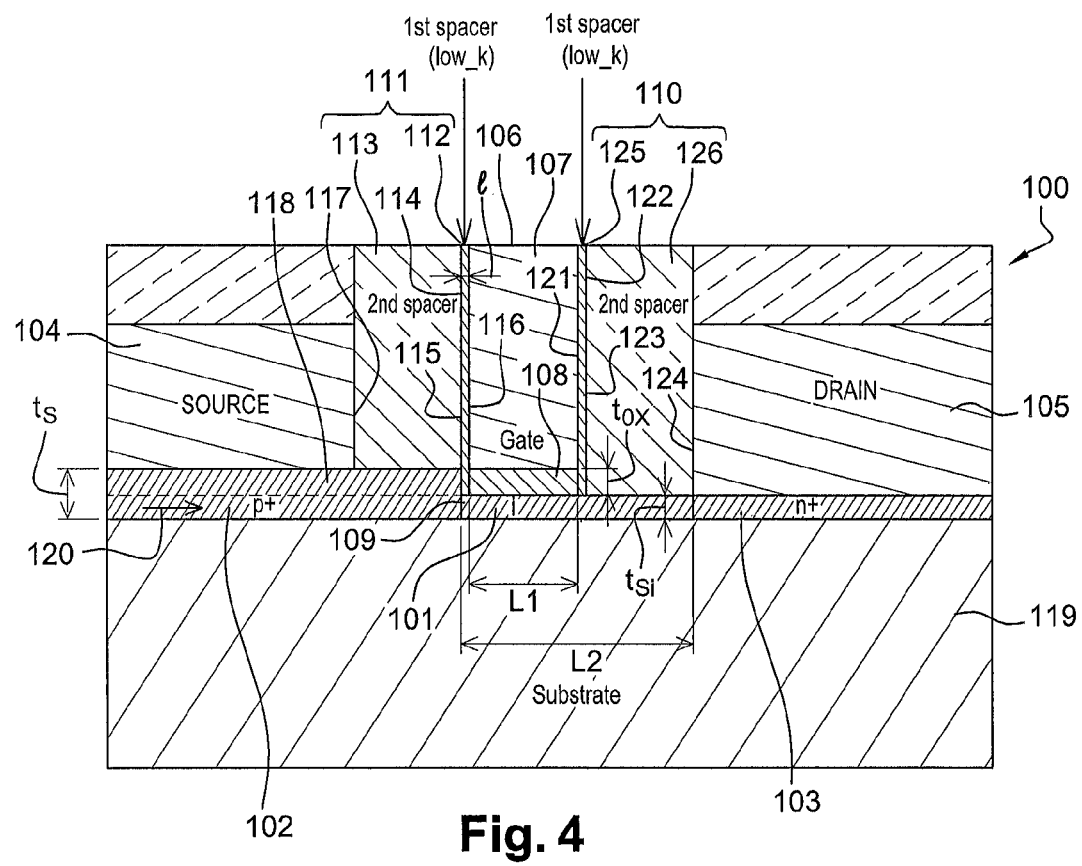
FIG. 4 represents the structure of a single gate tunnel effect transistor according to the invention.

The TFET transistor 200 comprises the same elements as those of the single gate tunnel effect transistor 100 of FIG. 4 (the communal references are identical in the two FIGS. 4 and 5). The transistor 200 includes in addition a lower part including particularly the lower control gate. This lower part is totally symmetrical from the upper part of the transistor compared to the plane of the substrate. Hereafter, the association of the notation "'" (prime symbol) with a numerical reference of an element of FIG. 5 indicates that it is a lower element (i.e. below the channel 101). Apart from the characteristics of the transistor 100 of FIG. 4, the transistor 200 comprises on the lower part thereof a lower gate structure 106' comprising:

a grid dielectric layer 108'; the material of the dielectric layer 108' is preferentially a dielectric material of high-k type such as $HfO_2$;

a gate conductive zone 107' below the gate dielectric layer 108' and in contact therewith; the material of the gate conductive zone 108' is for example a metal;

means 110' for forming a drain isolating space between the sides opposite each other of the gate structure 106' and the drain conductive region 105';

means 111' for forming a source isolating space between the sides opposite each other of the gate structure 106' and the source conductive region 104'.

The means 110' for forming a drain isolating space comprise:

a first spacer 125' having a first lateral face 121' and a second lateral face 122';

a second spacer 126' having a first lateral face 123' and a second lateral face 124'.

In the same way, the means 111' for forming a source isolating space comprise:

a first spacer 112' having a first lateral face 116' and a second lateral face 115';

a second spacer 113' having a first lateral face 114', and a second lateral face 117'.

The transistor 200 comes in the form of a series of successive elements situated below the assembly formed by the channel 101 surrounded by extension regions 102 and 103, in the longitudinal direction of the channel from the source extension region (marked by the arrow 120):

the source conductive region 104';

the second spacer 113' of the means 111' forming a source isolating space;

the first spacer 112' of the means 111' forming a source isolating space;

the lower gate structure 106';

the first spacer 125' of the means 110' forming a drain isolating space;

the second spacer 126' of the means 110' forming a drain isolating space;

the drain conductive region 105'.

The layout of this series of successive elements will be detailed hereafter.

The source conductive region 104' is below the source extension region 102 and is in contact therewith on the first part of the length thereof. This source conductive region 104' is for example a metal region obtained by silicidation.

The second spacer 113' of the means 111' forming a source isolating space is below the source extension region 102 and is in contact therewith over the part of the length thereof not covered by the source conductive region 104' (i.e. up to the interface with the channel 101). The second lateral face 117' of the second spacer 113' of the means 111' forming a source isolating space is in contact with the side of the source conductive region 104' opposite said second face.

Like the first upper spacer 112, the first spacer 112' of the means 111' forming a source isolating space has a length l (calculated along the longitudinal direction of the channel marked by the arrow 120) strictly below 5 nm, in a particularly advantageous manner comprised between 1 and 2 nm. The first spacer 112' is below the end 109 of the channel 101 and is in contact with this end over said length l. The second lateral face 115' of the first spacer 112' is in direct contact with the first lateral face 114' of the second spacer 113'.

The lower gate structure 106' is below the channel 101 over the length L1. The gate structure 106' comprises a gate dielectric layer 108' in contact with the channel 101 and a gate zone 107' below said gate dielectric layer.

Figure 6:
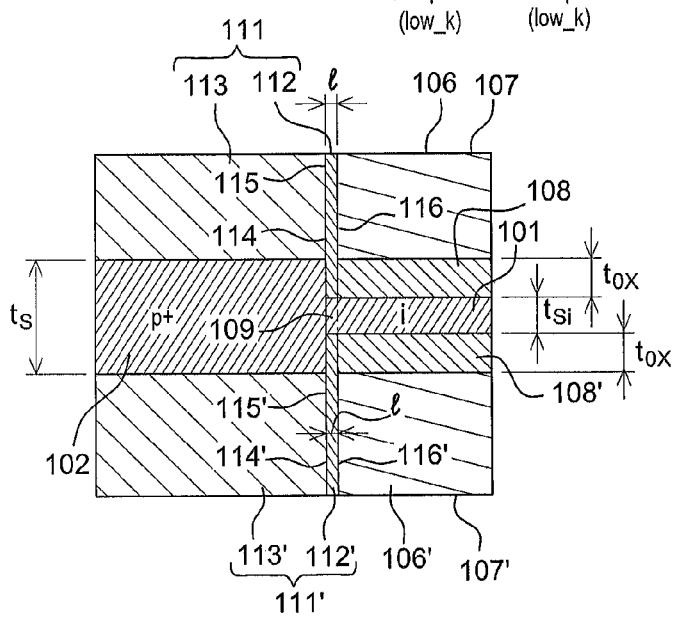
FIG. 6 represents an enlargement of the active zone of the transistor of FIG. 5.

The dielectric layer 108' and the gate zone 107' have lateral sides substantially aligned (i.e. have an identical length L1 along the direction 120). The first lateral face 116' of the first spacer 112' of the means 111' forming a source isolating space is in direct contact with the sides of the dielectric layer 108' and the gate zone 107' opposite. The first lateral face 116' of the first spacer 112' covers the side of the dielectric layer 108' over the whole thickness tOx thereof. As evoked above, the thickness tS of the source extension region 102 is greater than the thickness tSi of the channel 101; in a particularly advantageous manner, the source extension region 102 has a second increased thickness equal to the thickness tOx of the dielectric layer 108' such that the lower surfaces of the source extension region 102 and the gate dielectric layer 108' are aligned. In other words, the total thickness tS of the source extension region 102 is equal to the sum of the thickness tSi of the channel 101, the thickness tOx of the upper gate dielectric layer 108 and the thickness tOx of the lower gate dielectric layer 108' (i.e. tS=tSi+2.tOx). FIG. 6 represents an enlargement of the active zone of the transistor 200 showing the increase in the thickness tS of the source extension zone 102 compared to the thickness tSi of the channel 101.

The gate dielectric layer 108' is arranged between the gate zone 107' and the channel 101 and is made preferentially of a high-k type material such as $HfO_2$. In the extension of the first spacer 112', the dielectric layer 108' is below the channel 101 and is in contact therewith over the whole length thereof L1 (corresponding to a part of the length L2 of the channel).

The first lateral face 121' of the first spacer 125' of the means 110' forming a drain isolating space is in direct contact with the sides of the dielectric layer 108' and the gate zone 107' which are opposite. As previously in the case of the source spacers, the first lateral face 121' of the first spacer 125' covers the side of the dielectric layer 108' over the whole thickness tOx thereof.

The second lateral face 122' of the first spacer 125' of the means 110' forming a drain isolating space is in direct contact with the first lateral face 123' of the second spacer 126' of the means 110' forming a drain isolating space.

The first and second spacers 125' and 126' of the means 110' forming a drain isolating space are below the channel 101 and are in contact with the latter over the entire remaining length corresponding to L2-L1 not covered by the gate dielectric layer 108' and the first spacer 112'.

One then passes to the region situated below the drain extension region 103.

The drain conductive region 105' is below the drain extension region 103 and is in contact therewith over the whole length thereof. This drain conductive region 105' is for example a metal region obtained by silicidation.

The second lateral face 124' of the second spacer 126' of the means 110' forming a drain isolating space is in contact with the side of the drain conductive region 105' opposite said second face 124'.

Figure 7:
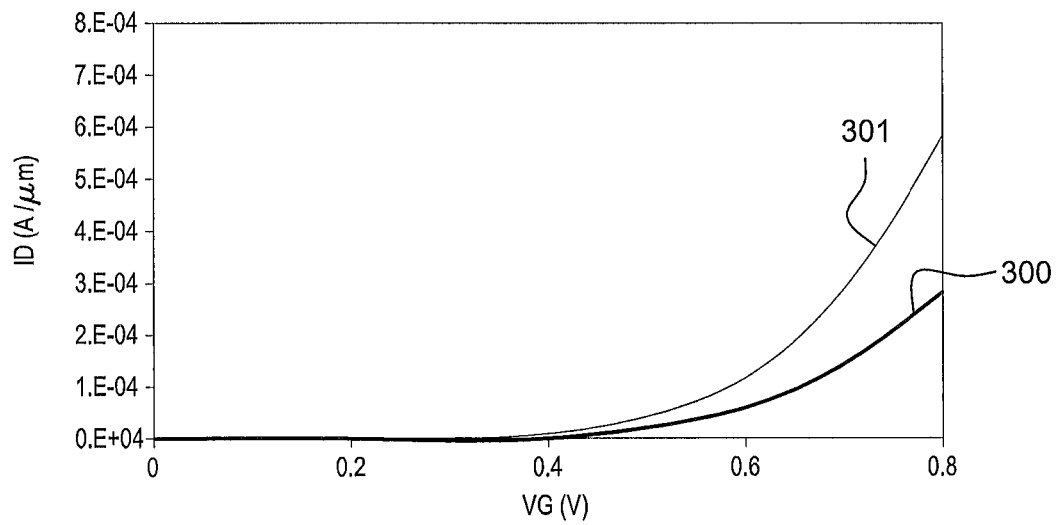
FIG. 7 represents the evolution of the current $I_{on}$ as a function of the gate voltage VG, positive for the transistors of FIG. 1 and FIG. 5.

FIG. 7 represents the evolution of the ID density of the current $I_{on}$ as a function of the positive gate voltage VG while maintaining a constant positive voltage at the level of the drain so as to reverse bias the PiN diode. Two current-voltage characteristics are represented: the first characteristic 300 corresponding to the characteristic of the transistor 1 of FIG. 1 and the second characteristic 301 corresponds to the characteristic of the transistor 200 of FIG. 5. The results presented on its two curves clearly show that the current $I_{on}$ is much higher in the case of the transistor 200 according to the invention than in the case of the transistor 1 according to the prior art.

Figure 8:
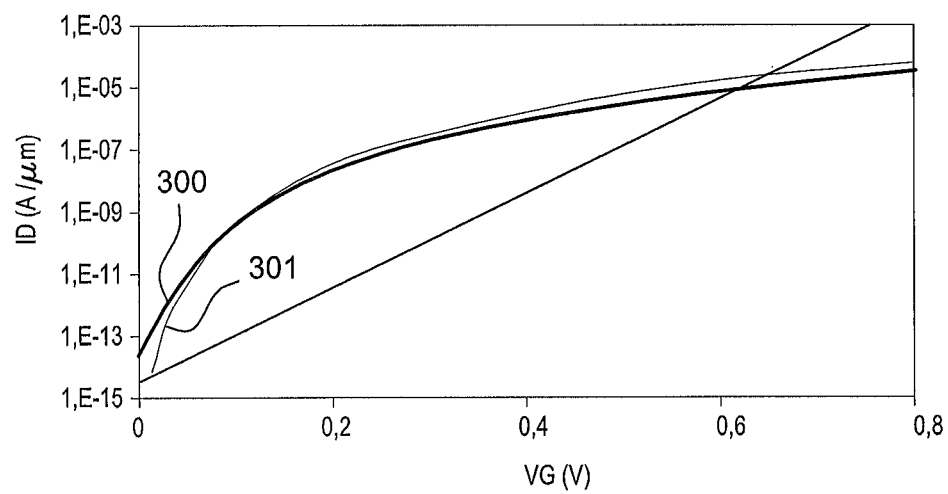
FIG. 8 represents the same current-voltage characteristics as those of FIG. 7 in semi-logarithmic scale.

FIG. 8 represents the same current-voltage characteristics as those of FIG. 7 but in semi-logarithmic scale. It will be observed that the sub-threshold slope of the transistor according to the invention is greater than the sub-threshold slope of the transistor according to the prior art. This effect is particularly interesting in so far as the higher the sub-threshold slope, the more the sub-threshold current will be negligible for a given gate voltage.

Figure 9A:
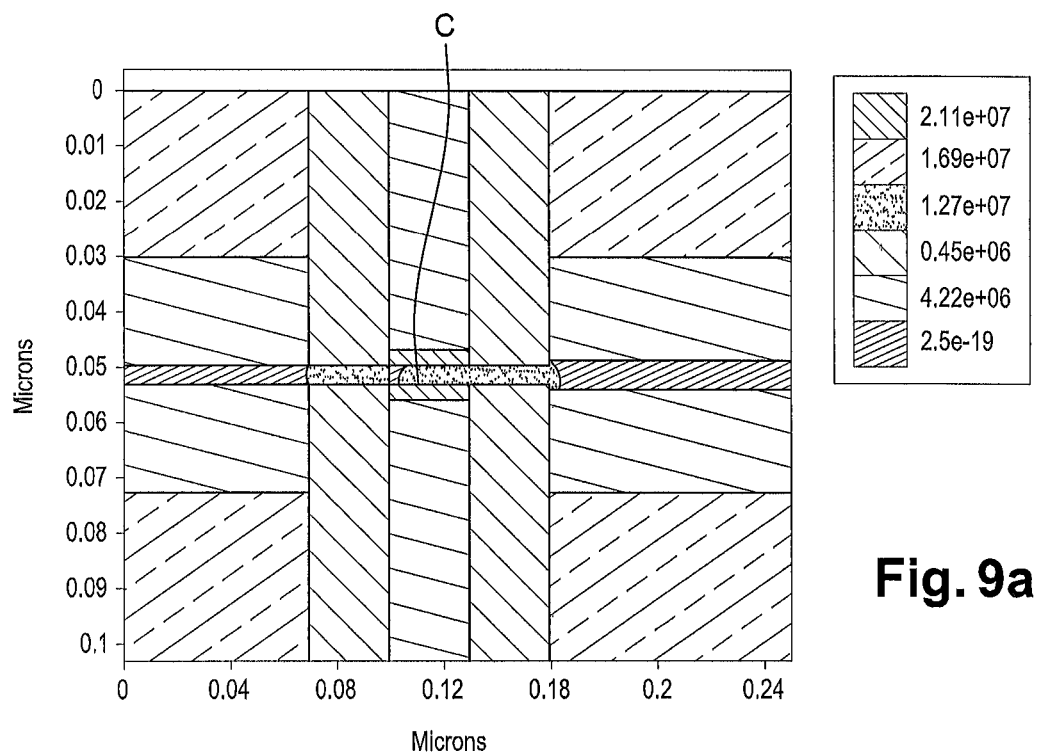
FIGS. 9a to 9c illustrate the conduction current densities for TFET transistors having different thicknesses of source extension region.
Figure 9B:
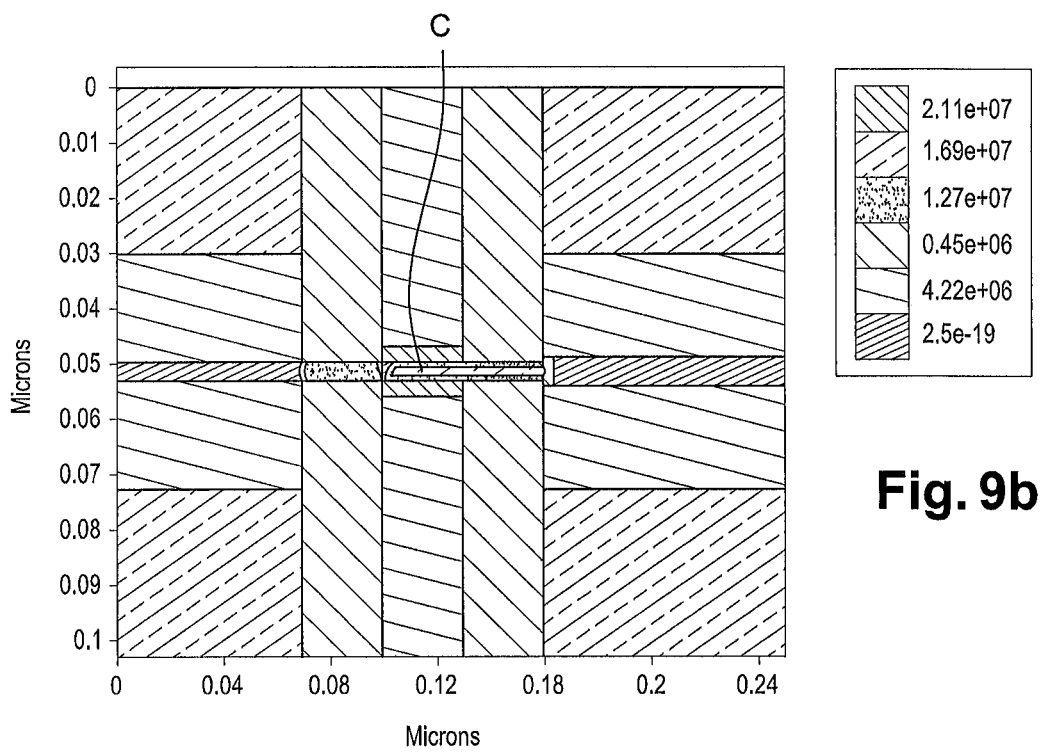
Figure 9C:
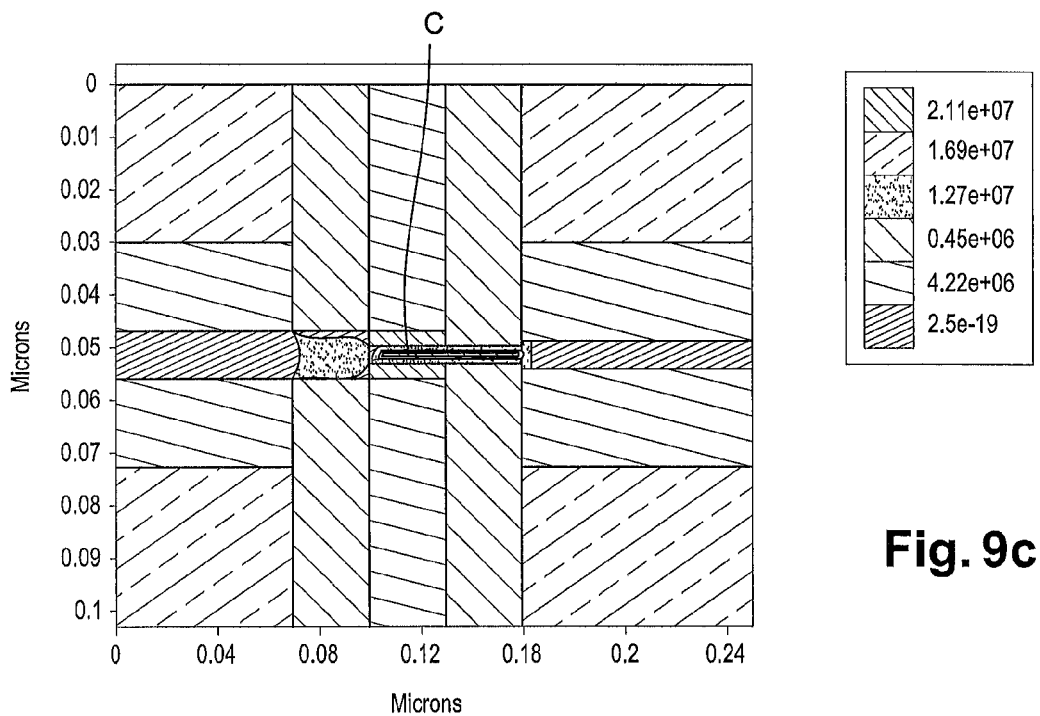

FIGS. 9a to 9c illustrate current densities for different TFET transistors each having a channel thickness tSi equal to 3 nm and a thickness tOx of lower and upper gate dielectric layer equal to 3 nm.

Figure 10:
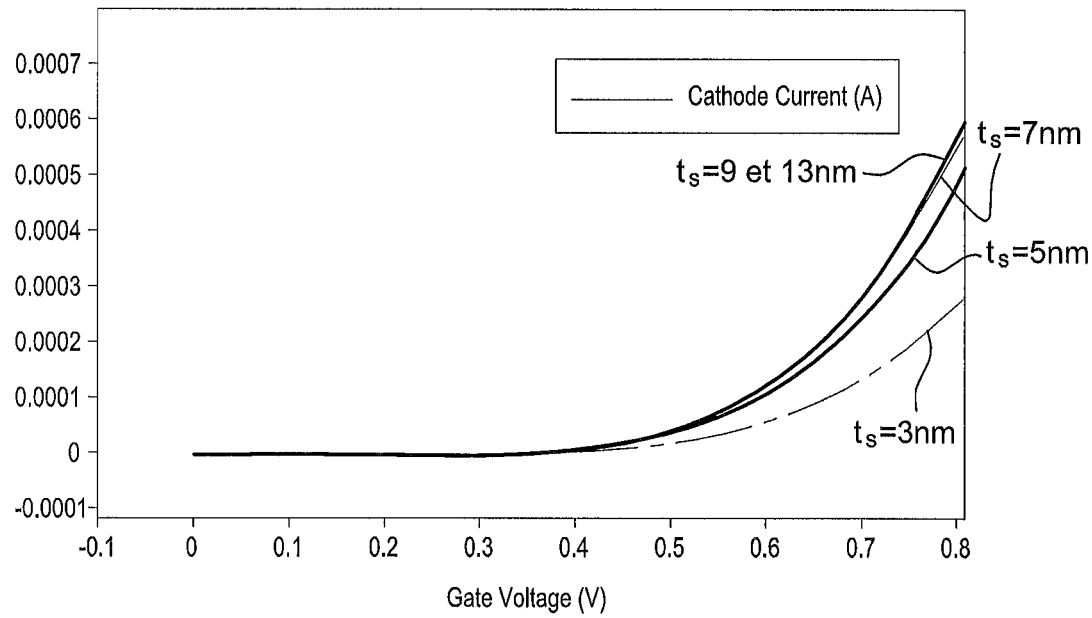
FIG. 10 represents the evolution of the conduction current density as a function of the gate voltage for TFET transistors having different thicknesses of source extension region.

The transistors used are respectively:
- a transistor such as the transistor 1 of FIG. 1 for which the thickness tS of the source extension region is equal to 3 nm, in other words to the thickness tSi of the channel (FIG. 9a);
- a transistor according to the invention for which the total thickness tS of the source extension region is equal to 5 nm; in other words, the thickness tS is strictly greater than the thickness of the channel tSi and below the sum of the thickness tSi of the channel, the thickness tOx of the upper gate dielectric layer and the thickness tOx of the lower gate dielectric layer (i.e. tS=tSi+2.tOx) (FIG. 9b);
- a transistor according to the invention as represented in FIG. 5 for which the total thickness tS of the source extension region is equal to =9 nm; in other words, the thickness tS is equal to the sum of the thickness tSi of the channel, the thickness tOx of the upper gate die-electric layer and the thickness tOx of the lower gate dielectric layer (i.e. tS=tSi+2.tOx) (FIG. 9c);

It will be noted that the current density in the channel (referenced by the letter C in FIGS. 9a to 9c) increases when the thickness tS increases. An increase in the thickness tS beyond tSi+2.tOx (or beyond tSi+tOx in the case of a single gate transistor) does not make it possible to further increase the current density in the channel. On the other hand, such a thickness could lead to a contact between the source extension region and the first low-k spacer (i.e. the first spacers 112 and 112') above the gate dielectric layer: such a contact is not desirable because it could then induce parasitic capacitances. The absence of effect of an increase in the thickness tS beyond tSi+2.tOx is confirmed by FIG. 10, which represents the evolution of the conduction current density as a function of the gate voltage for TFET transistors having different thicknesses of source extension region. It will be noted in this figure that the conduction current changes little when the thickness becomes greater than or equal to 9 nm (the curves for tS=9 and 13 nm are virtually merged); the reduction is on the other hand already substantial when one passes from 9 nm to 7 nm and even more substantial when one passes from 9 nm to 5 nm.

Figure 11A:
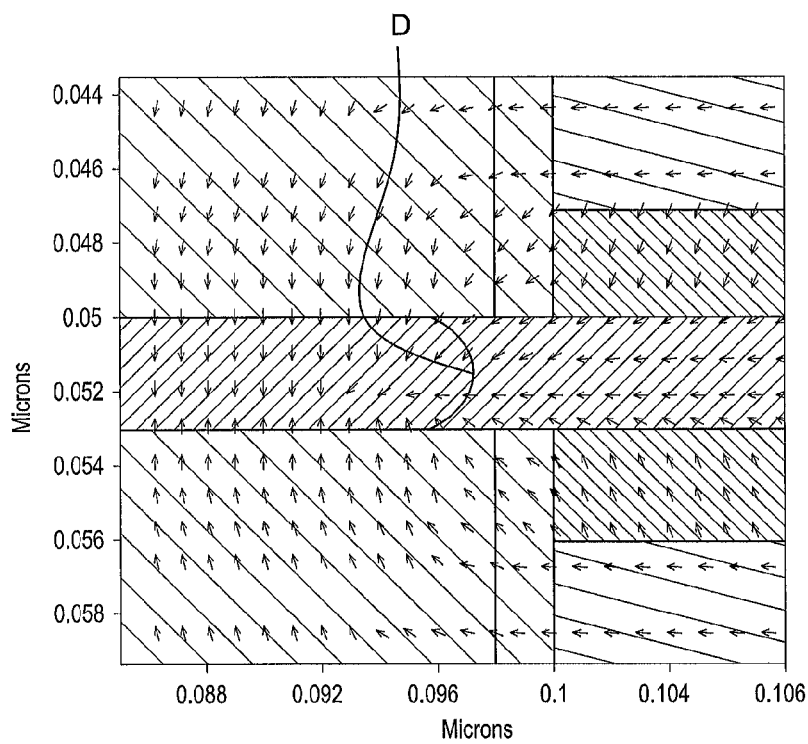
FIGS. 11a to 11c illustrate the depletion zones for TFET transistors having different thicknesses of source extension region.
Figure 11B:
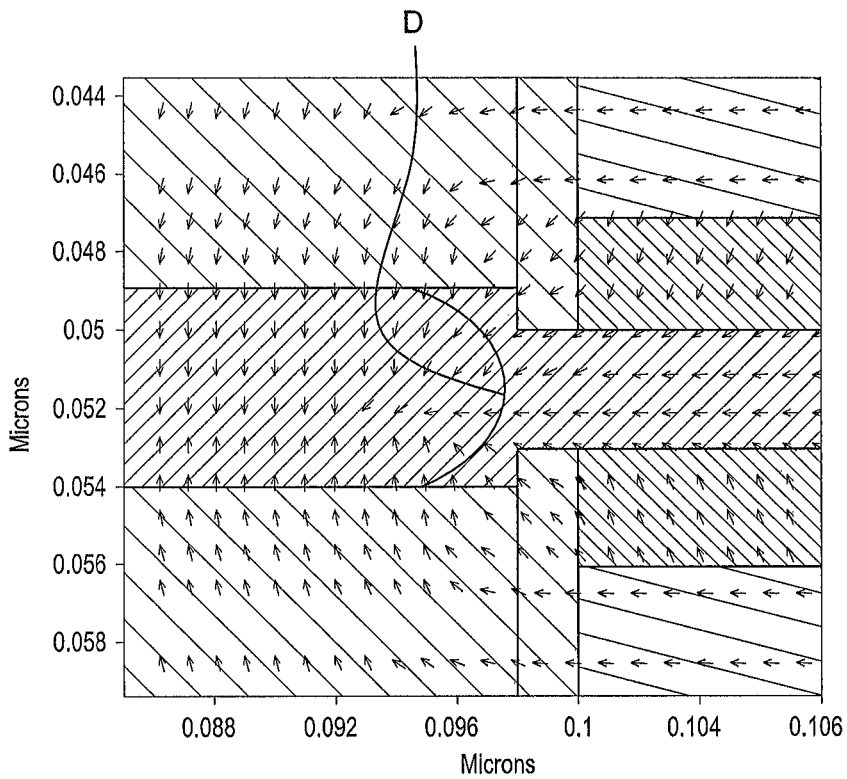
Figure 11C:
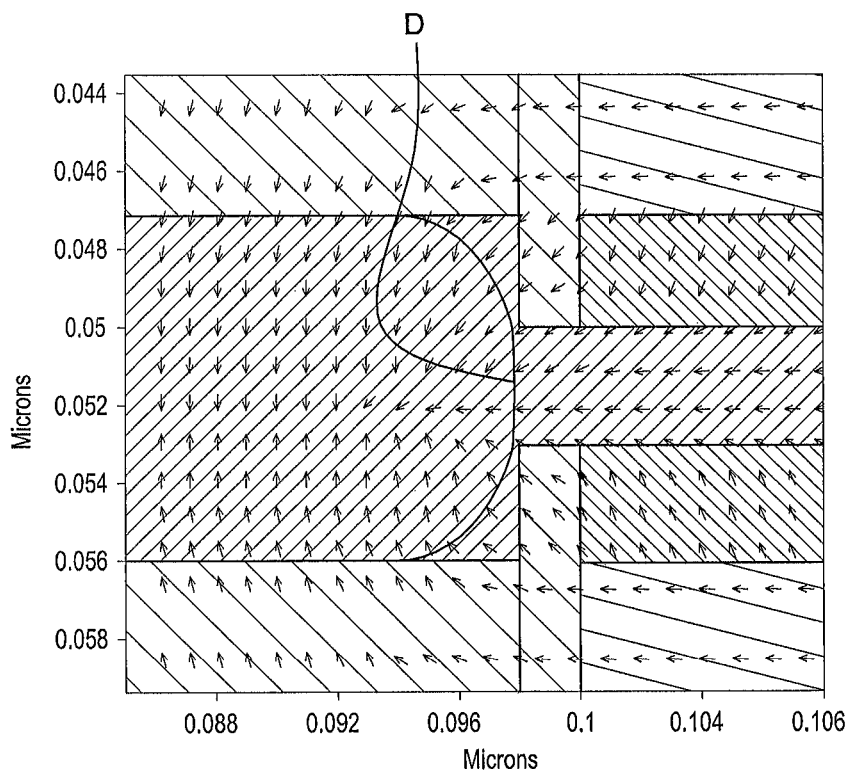

The influence of the thickness tS on the transistor according to the invention is explained by the influence of said thickness on the depletion zone at the interface between the channel and the source extension zone. FIGS. 11*a* to 11*c* illustrate the depletion zones D (the solid line delimits the depletion zone) for TFET transistors having thicknesses of source extension region equal to 3 nm (FIG. 11*a*), 5 nm (FIG. 11*b*) and 9 nm (FIG. 11*c*). The greater the thickness, the more the solid line approaches the interface such that the depletion region is reduced.

It may nevertheless be envisaged to use a thickness tS of source extension region greater than tSi+2.tOx in the case of a double gate transistor (or greater than tSi+tOx in the case of a single gate transistor) but this assumes faceting the lateral parts of the source extension region so as to avoid contacts with the first low-k spacer. Such faceting processes making it possible to raise the source extension region above the upper surface of the upper gate dielectric layer and/or below the lower surface of the lower gate dielectric layer are for example described in the documents (in particular on the angle of the facets) "Impact of Epi Facets on Deep Submicron Elevated Source/Drain MOSFET Characteristics" (Jie J. Sun and Carlton M. Osburn,—IEEE TRANSACTIONS ON ELECTRON DEVICES, VOL. 45, NO. 6, JUNE 1998) or "Ultra-shallow in-situ-doped raised source drain structure for sub-tenth micron CMOS" (Y. Nakahar, K. Takeuchi, T. Tatsumi, Y. Ochiai, S. Manako, S. Samukawa and A. Furukawa, VLSI symp 1996, pp. 174-475).

Figure 12:
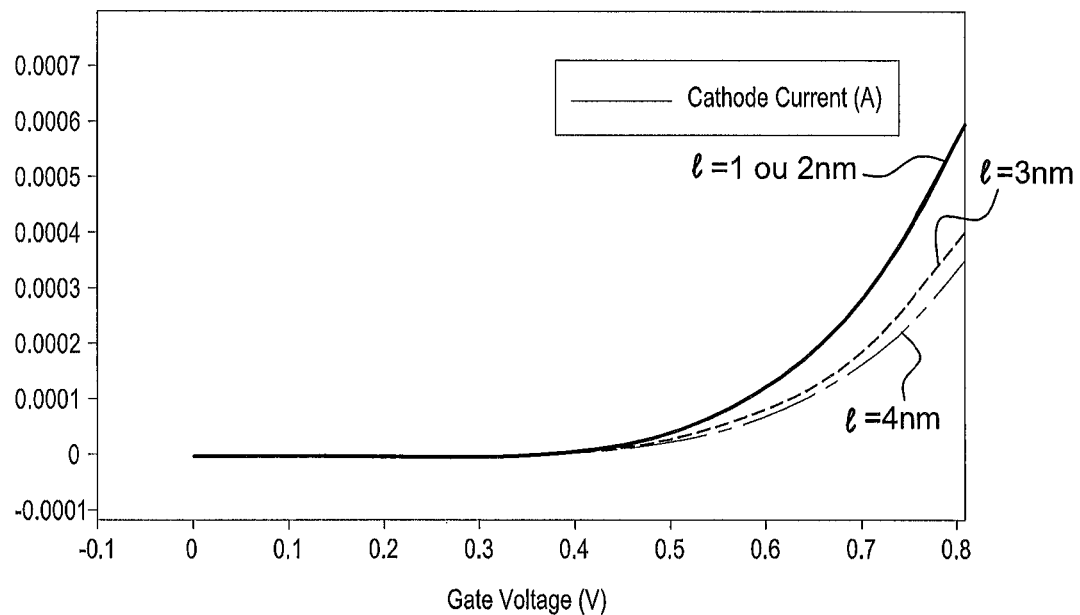
FIG. 12 represents the evolution of the conduction current density as a function of the gate voltage for TFET transistors having different lengths of spacer.

As has been evoked above, the first upper and lower spacers 112 and 112' of the means 111 and 111' forming a source isolating space each have a length l strictly below 5 nm and in a particularly advantageous manner comprised between 1 and 2 nm. The effect of this length on the transistor according to the invention is illustrated in FIG. 12, which represents four current-voltage characteristics (conduction current Ion as a function of the gate voltage) for four transistors according to the invention having respectively lengths of spacer of 1, 2, 3 and 4 nm. The characteristics of the transistors according to the invention having a length of first spacer of 1 or 2 nm are very similar and have higher conduction currents than the characteristics of transistors according to the invention having lengths of first spacer equal to 3 or 4 nm.

It will be noted that one of the consequences of the structure of the transistor according to the invention is that the doping of the source extension region is set back in relation to the gate by a length corresponding to the length of the first spacer (i.e. preferentially comprised between 1 and 2 nm). Technologically, the doping of the source region is carried out after the formation of the first spacer: consequently, the doping stops before the first spacer. Thus, there is no P+/high-k type contact and depletion at the level of the source extension region is avoided.

FIGS. 13*a* to 13*h* illustrate the steps of a first embodiment of a method of manufacturing a device according to the invention. According to this first embodiment variant, a single epitaxy will be used for the formation of the source and drain zones. The example is that of an N-type TFET transistor.

Figure 13A:
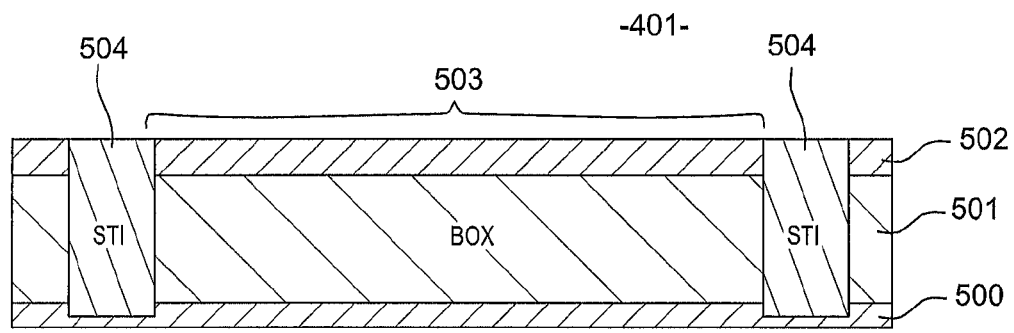
FIGS. 13a to 13h illustrate the steps of a first embodiment of a method of manufacturing a device according to the invention.

According to the first step 401 illustrated in FIG. 13*a*, a substrate is used of the semiconductor on insulator or SOI (silicon on insulator) type comprising a first semiconductive layer 500, for example silicon based, on which rests an insulating layer 501 such as a buried oxide layer (BOX) based on $SiO_2$ (the BOX may be thick, for example over a thickness of 145 nm, or preferentially thin for the electrostatic control, for example over a thickness of 25 nm). One then has a thin semiconductive layer 502 (for example a thin film of silicon over a thickness below 30 nm or even below 10 nm for an SOI technology of "fully depleted" type).

According to this same step 401, the active zone 503 will be defined, for example for the formation of trenches 504. Said trenches are formed by a shallow trench isolation (STI) process. In STI, a localised etching of the trenches in the SOI substrate is carried out. This step is followed by a filling of the silica trenches 504.

The active zone 503 may also be formed by MESA etching.

Figure 13B:
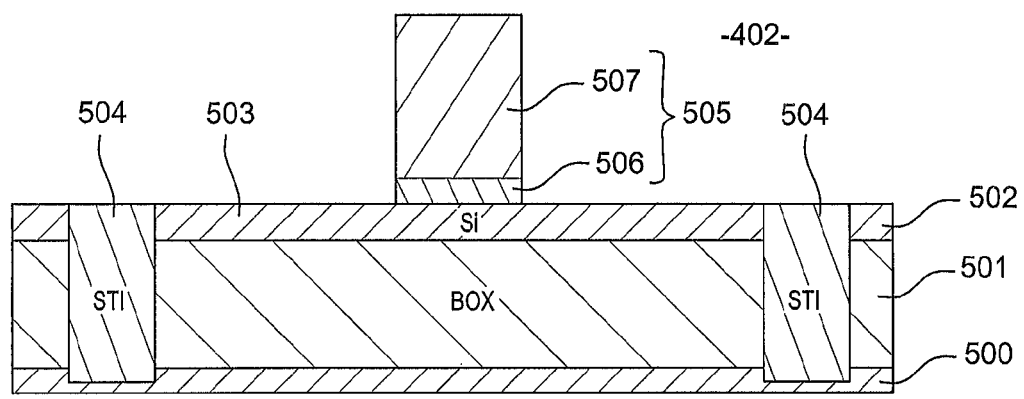

The second step 402 illustrated in FIG. 13*b* consists in forming the gate structure 505. To do this, for example a high-k dielectric layer 506 such as HfO2 then a metal layer and/or doped polysilicon 507 is deposited. The gate zone 505 is then obtained by lithography and etching (with stoppage on the silicon layer 502) of the dielectric and metal/polySi layers deposited previously. It will be noted that it is also possible to deposit a hard mask (for example made of SiN) above the gate zone 505 so as not to have silicon apparent at the top of the gate zone (and avoid an impact on the gate surface at the moment of the source and drain epitaxies to come).

Figure 13C:
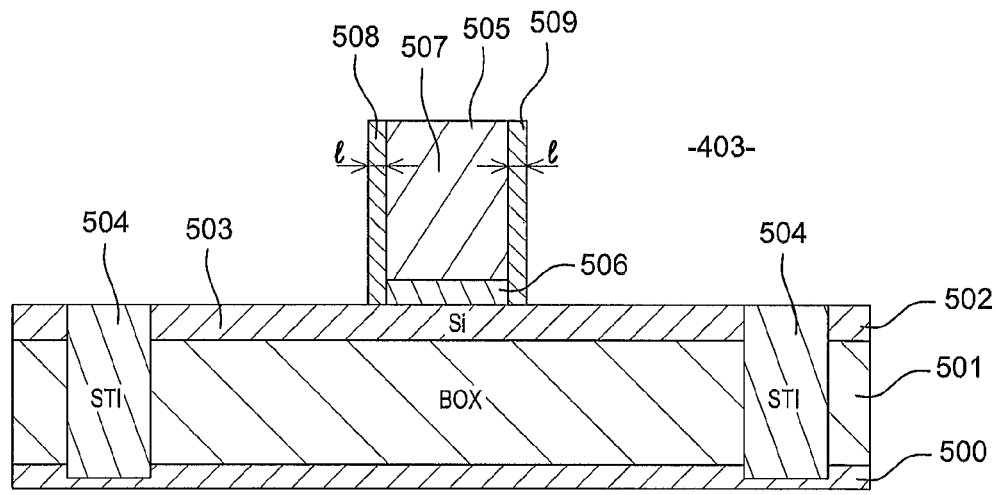

The third step 403 illustrated in FIG. 13*c* consists in forming the first spacers 508 and 509 (source and drain side equivalent to the first spacers 112 and 125 of FIG. 4). This realisation is for example obtained by carrying out a conformal deposition of a dielectric material of low-k type (such as $SiO_2$) over a thickness typically below 10 nm followed by an anisotropic etching of RIE (Reactive Ion Etching) dry etching type. This anisotropic etching makes it possible to define the length l of the spacers 508 and 509 (calculated along the longitudinal direction of the channel) strictly below 5 nm, typically comprised between 1 and 4 nm.

Figure 13D:
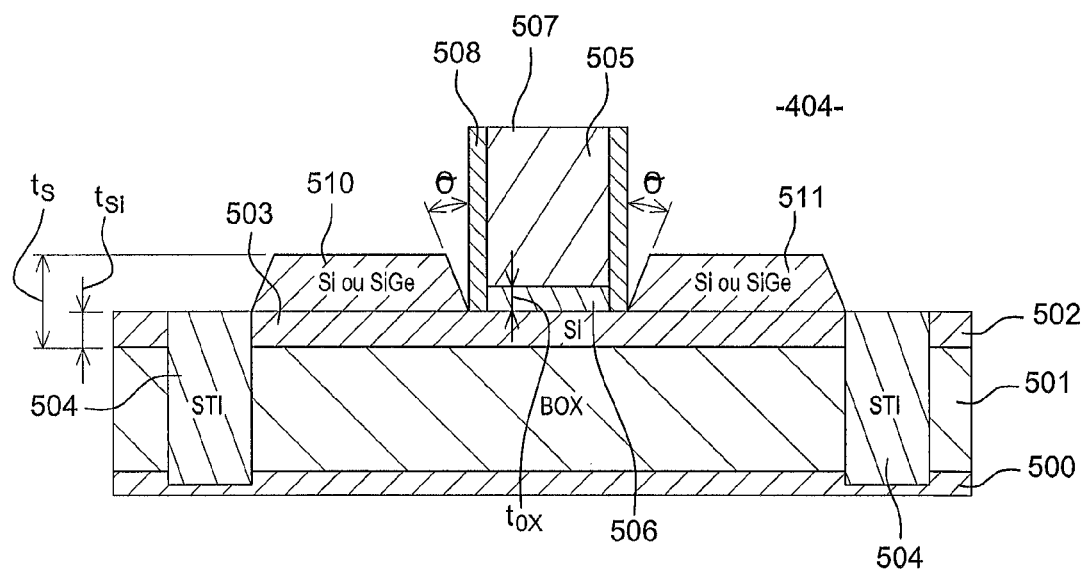

According to step 404 illustrated in FIG. 13*d*, one forms the source 510 and drain 511 extension regions by selective epitaxy of a semiconductor material (for example non-doped Si or SiGe), the implantation for carrying out the N and P dopings remaining to be done.

The selective epitaxy makes it possible particularly to obtain a thickness $t_S$ of the source extension region 510 greater than the thickness $t_{Si}$ of the channel (i.e. thickness of the active zone 503).

Unlike the case of FIG. 4, the increased thickness is here greater than (and not equal) to the thickness $t_{Ox}$ of the dielectric layer 506. In order to avoid a contact between the source extension region and the spacer 508 above the dielectric layer 506, it is thus here preferable to facet the source extension region by introducing an angle θ between the respective sides of the source extension region 510 and the first spacer 508.

The angle θ is comprised between 1° and 45°.

The thickness of the source extension zone 510 will typically be chosen comprised between 5 and 20 nm, the choice of said thickness being made so as to minimise parasitic capacitances and resistances between the source/drain zones and the gate zone.

Obviously, it is also possible to form a perfectly rectangular source extension zone (case of FIGS. 4 and 5) without facets.

Due to the use of a single epitaxy, it turns out here that the drain extension zone 511 is perfectly symmetrical from the source extension zone 510. Consequently, the zones 510 and 511 here have the same thickness, unlike the cases of FIGS. 4 and 5 where only the source extension zone was raised.

Figure 13E:
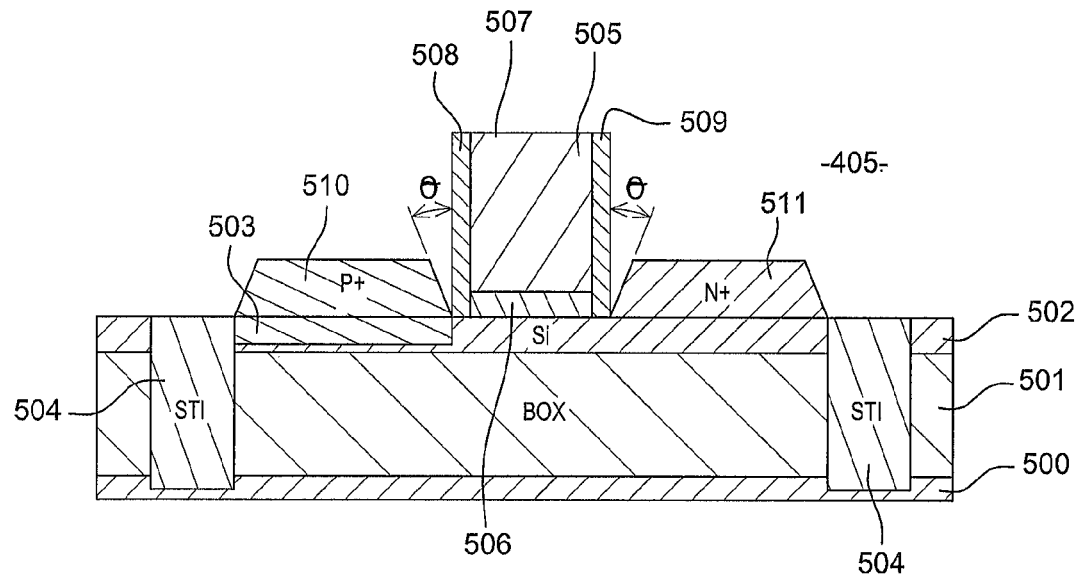

According to step 405 illustrated in FIG. 13e, the P+ doping of the source extension zone 510 is carried out. Said doping is carried out by firstly defining a resin casing (not represented) in which the zone to be doped is opened (the opening is obtained by lithography and etching). The opened zone is p+ doped by ion implantation (for example an implantation by B ions or BF2 ions). The resin casing is then removed by a "stripping" or "lift-off" type method.

Figure 13F:
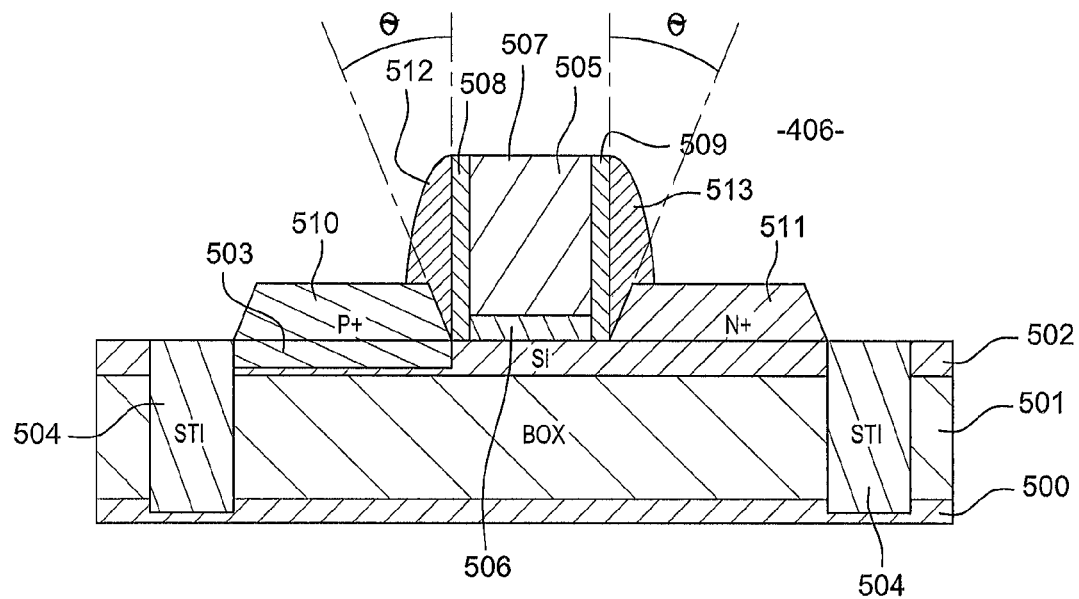

According to step 406 illustrated in FIG. 13f, the second spacers 512 and 513 respectively in contact with the first spacers 508 and 509 are defined. This definition may be obtained by conformal deposition of a dielectric material such as $SiO_2$ or SiN (or a $SiN/SiO_2$ stack) then by anisotropic etching. The duration of the etching depends on the length of the second spacers typically comprised between 5 and 15 nm.

Figure 13G:
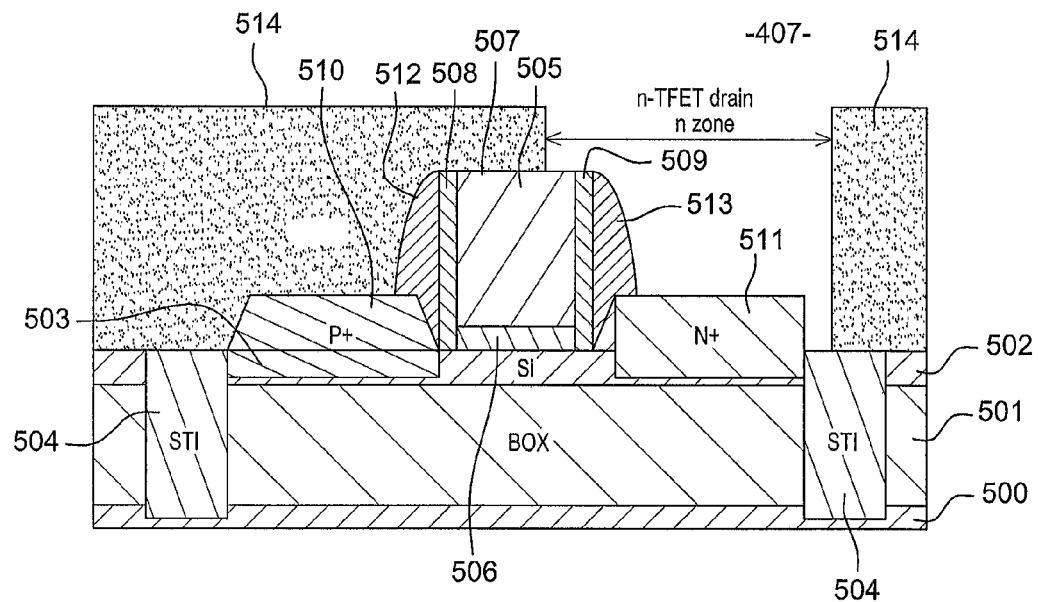

According to step 407 illustrated in FIG. 13g, the N+ doping of the drain extension zone 511 is now going to be carried out. This doping is carried out by firstly defining a resin casing 514 in which the zone to be doped is opened (the opening is obtained by lithography and etching). The opened zone is n+ doped by ion implantation (for example an implantation by As or P ions).

Figure 13H:
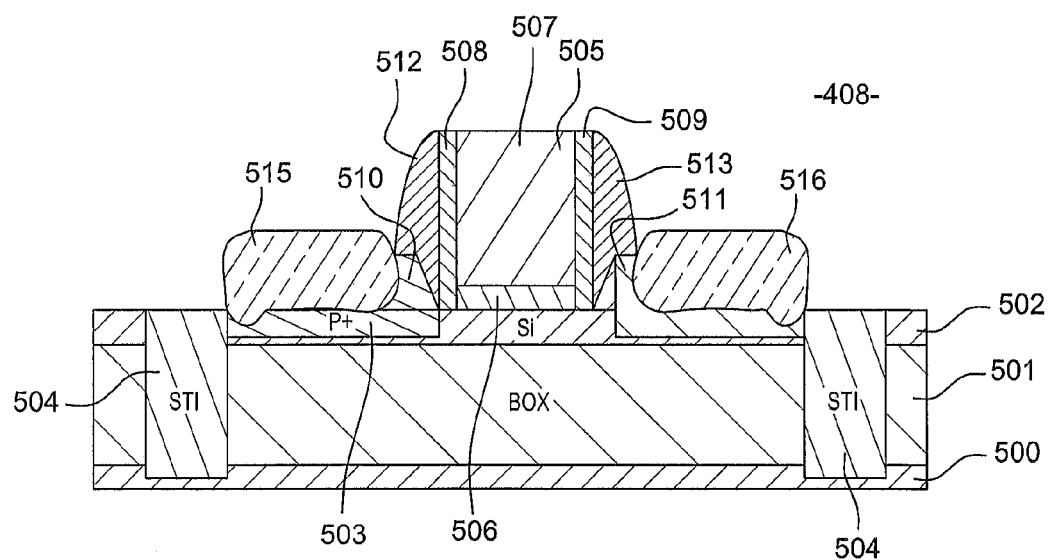

According to step 408 illustrated in FIG. 13h, the device according to the invention is finalised; to do this, the resin casing 514 is removed by a "stripping" or "lift-off" type method. In order to activate the doping atoms and to mend defects due to the bombardment, an implantation (also known as activation annealing) is then carried out. In order to minimise the resistance of the drain 511 and source 510 extension zones made of doped monocrystalline silicon, a step of silicidation of said zones 515 and 516 is also carried out; the silicidation corresponds to the metallisation of said zones.

FIGS. 14a to 14f illustrate the steps of a second embodiment of a method of manufacturing a device according to the invention. According to this second embodiment variant, a single epitaxy will be used for the formation of the source zone (and not epitaxy for the drain zone). The example is again that of an N-type TFET transistor.

The first steps, not represented, of this second variant are identical to the steps illustrated in FIGS. 13a to 13c.

Figure 14A:
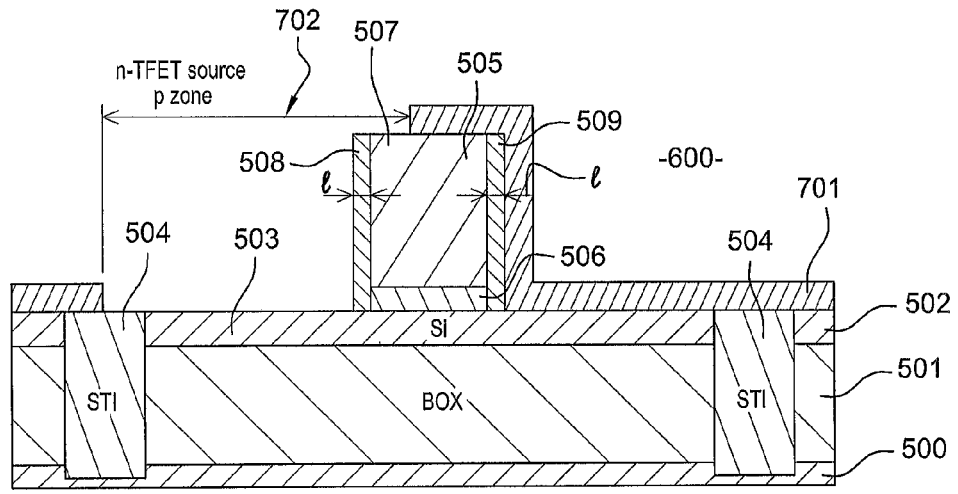
FIGS. 14a to 14f illustrate the steps of a second embodiment of a method of manufacturing a device according to the invention.

According to step 600 illustrated in FIG. 14a, a hard mask 701 is deposited covering all the device with the exception of the source zone where a raised source extension zone is going to be epitaxied. To do this, a dielectric layer (oxide or nitride/oxide) is deposited then a lithography and an etching of the dielectric layer is carried out to open the layer 701 at the level of the zone 702 where it is wished to carry out the epitaxy.

Figure 14B:
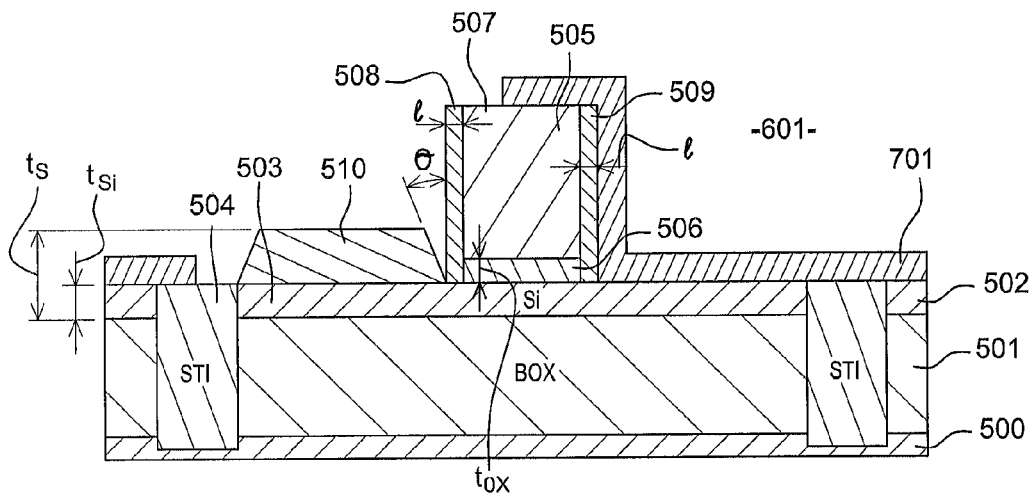

According to step 601 illustrated in FIG. 14b, the source extension region 510 is formed by selective epitaxy of a semiconductor material (for example non-doped Si or SiGe, the implantation for carrying out the P doping remaining to be done).

The selective epitaxy makes it possible particularly to obtain a thickness $t_S$ of the source extension region 510 greater than the thickness $t_{Si}$ of the channel (i.e. thickness of the active zone 503).

Unlike the case of FIG. 4, the increased thickness is here greater than (and not equal) to the thickness $t_{Ox}$ of the dielectric layer 506. In order to avoid a contact between the source extension region and the spacer 508 above the dielectric layer 506, it is thus here preferable to facet the source extension region by introducing an angle θ between the respective sides of the source extension region 510 and the first spacer 508.

The thickness of the source extension zone 510 will typically be chosen comprised between 5 and 20 nm.

Obviously, it is also possible to form a perfectly rectangular source extension zone (case of FIGS. 4 and 5) without facets. Unlike FIG. 13d, here an epitaxy is used uniquely for the formation of a raised source zone and not for the simultaneous formation of raised source and drain zones.

It will be noted that it is also possible to carry out directly the doping of the source extension zone 510 by implementing a doped epitaxy (here for example a P+ zone with silicon or SiGe doped in situ with boron).

Figure 14C:
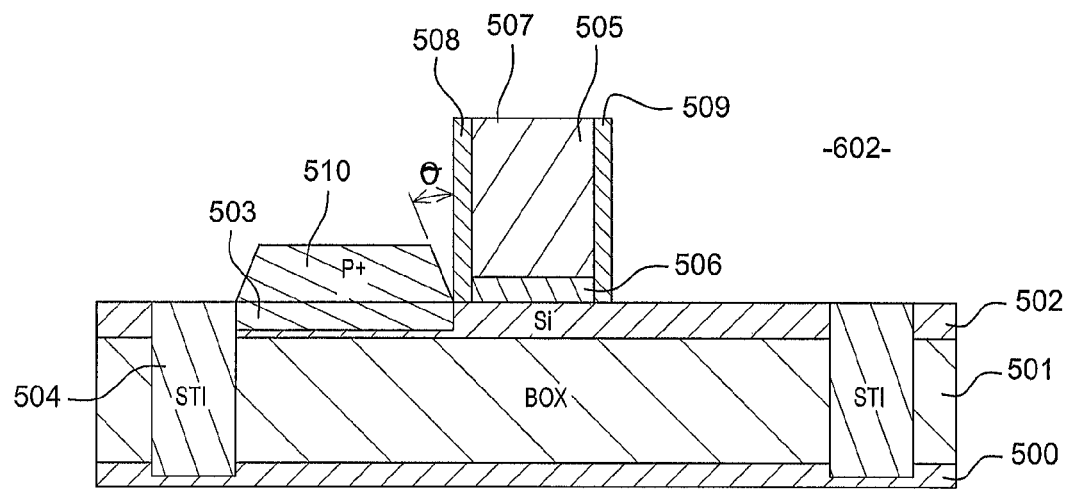
Figure 14D:
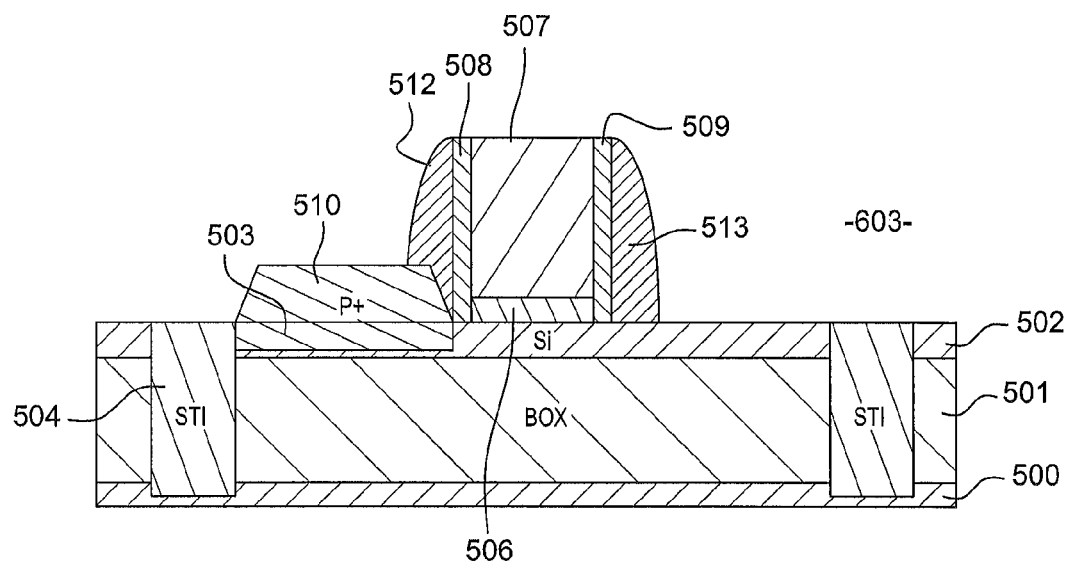

According to step 602 illustrated in FIG. 14c, the P+ doping of the source extension zone 510 is carried out. Said doping is carried out by firstly defining a resin casing (not represented) in which the zone to be doped is opened (the opening is obtained by lithography and etching). The opened zone is p+ doped by ion implantation (for example an implantation by B ions or BF2 ions). The resin casing as well as the hard mask 701 are then removed by a "stripping" or "lift-off" type method According to step 603 illustrated in FIG. 14d, the second spacers 512 and 513 respectively in contact with the first spacers 508 and 509 are defined. This definition may be obtained by conformal deposition of a dielectric material such as $SiO_2$ or SiN (or a $SiN/SiO_2$ stack) then by anisotropic etching. The duration of the etching depends on the length of the second spacers typically comprised between 5 and 15 nm.

Figure 14E:
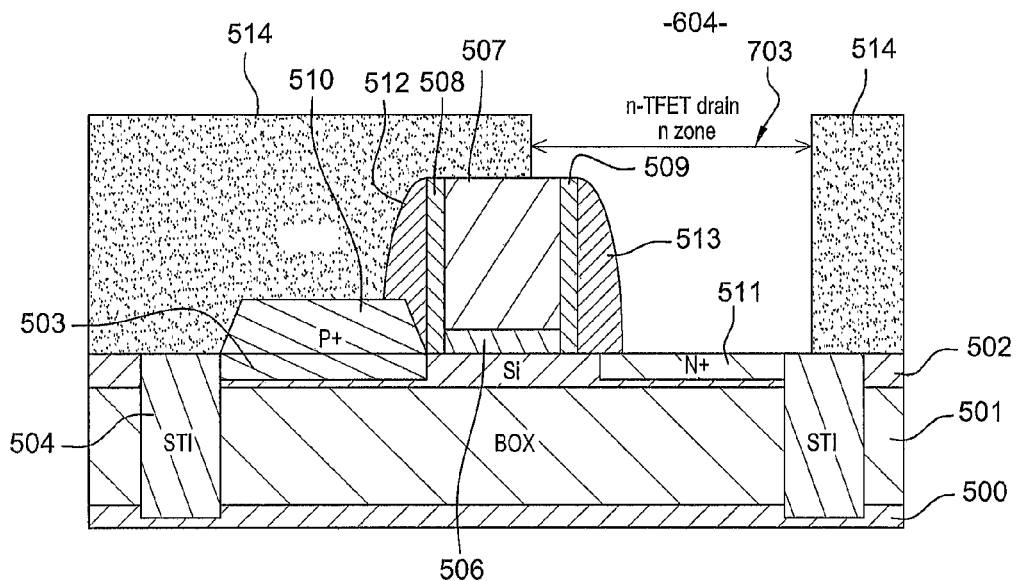

According to step 604 illustrated in FIG. 14e, the N+ doping of the drain extension zone 511 is going to be carried out. This doping is carried out by firstly defining a resin casing 514 in which the zone 703 to be doped is opened (the opening is obtained by lithography and etching). The opened zone is n+ doped by ion implantation (for example an implantation by As or P ions) so as to obtain the doped drain extension zone 511. Unlike the drain extension zone 511 of FIG. 13h (first variant), the drain extension zone 511 of FIG. 14e is not raised (i.e. the N+ doping is carried out directly in the active zone). Moreover, the fact of having previously formed the second spacer leads to an offset of the drain extension zone 511 making the device asymmetric: this asymmetry reduces the ambipolar character of the device as well as the current in the blocked state.

Figure 14F:
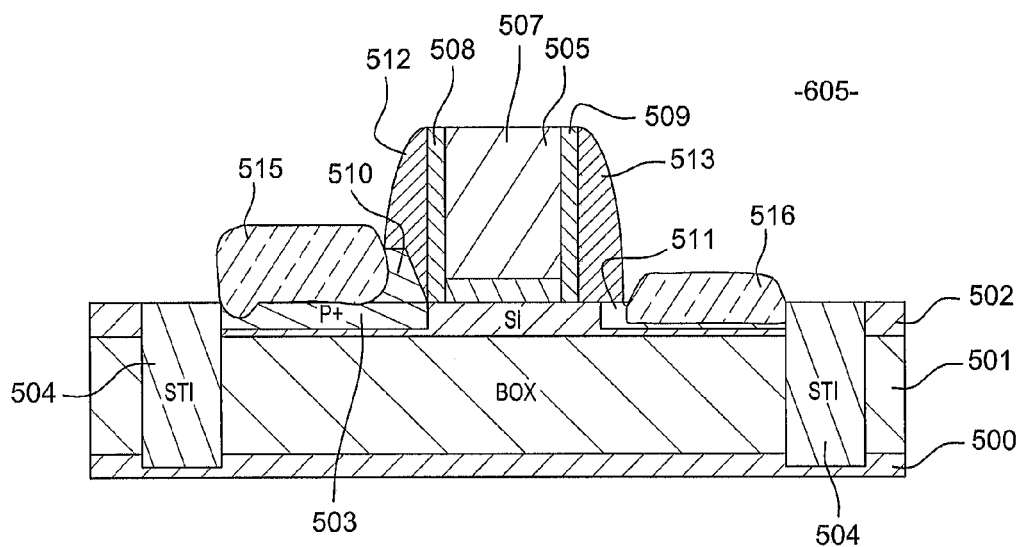

According to step 605 illustrated in FIG. 14f, the device according to the invention is finalised; to do this, the resin casing 514 is removed by a "stripping" or "lift-off" type method. An implantation annealing is then carried out and also a step of silicidation of said zones 515 and 516 is also carried out; the silicidation corresponds to the metallisation of said zones. The main drawback of this solution is that only a reduced surface area is available for carrying out the silicidation on the drain side.

FIGS. 15a to 15d illustrate the steps of a third embodiment of a method of manufacturing a device according to the invention aiming to resolve the aforementioned problem. According to this third embodiment variant, two epitaxies will be used: a first epitaxy for the formation of the source zone and a second epitaxy for the drain zone. The example is again that of an N-type TFET transistor.

The first steps, not represented, of this third variant are identical to the steps illustrated in FIGS. 13a to 13c then steps 14a to 14d.

Figure 15A:
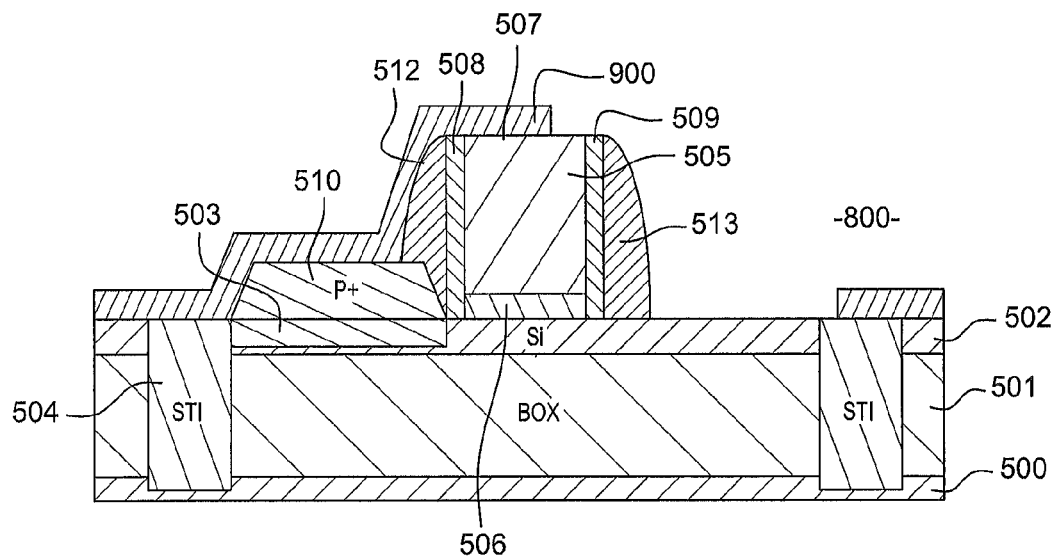
FIGS. 15a to 15d illustrate the steps of a third embodiment of a method of manufacturing a device according to the invention.

According to step 800 represented in FIG. 15a, a hard mask 800 is deposited covering the entire device with the exception of the drain zone where a raised drain extension zone is going to be epitaxied. To do this, a dielectric layer (oxide or nitride/oxide) is deposited then a lithography and an etching of the dielectric layer is carried out to open the layer 900 at the level of the zone where it is wished to carry out the epitaxy.

Figure 15B:
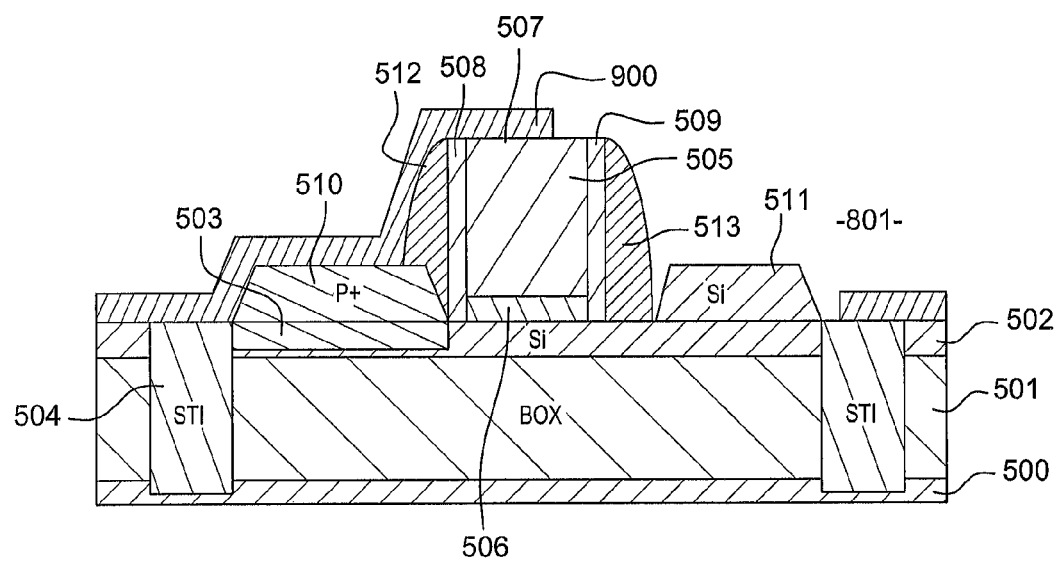

According to step 801 illustrated in FIG. 15b, the drain extension region 511 is formed by selective epitaxy of a semiconductor material (for example non-doped Si or Si:C, the implant for carrying out the N doping remaining to be done).

The selective epitaxy makes it possible particularly to obtain a thickness of the drain extension region 511 greater than the thickness of the channel (i.e. thickness of the active zone 503).

Nevertheless, unlike the case of FIG. 13d, the drain extension region 511 is made independently of the source extension region 510 such that the thicknesses of said regions 510 and 511 are not necessarily identical. In the same way, the drain extension region is here represented with facets but the latter remain optional and are not necessarily identical to the facets of the source extension region forming an angle θ with the first spacer 508. In other words, this third embodiment makes it possible to relax considerably the stresses by separating the formation of the two drain and source extension zones while at the same time making it possible to raise the drain extension zone (and thus to obtain a bigger silicidation zone).

The thickness of the drain extension zone 511 will typically be chosen comprised between 5 and 20 nm.

It will be noted that it is also possible to carry out directly the doping of the drain extension zone 511 by implementing a doped epitaxy (here for example a N+ zone with silicon or Si:C doped in situ with P).

Figure 15C:
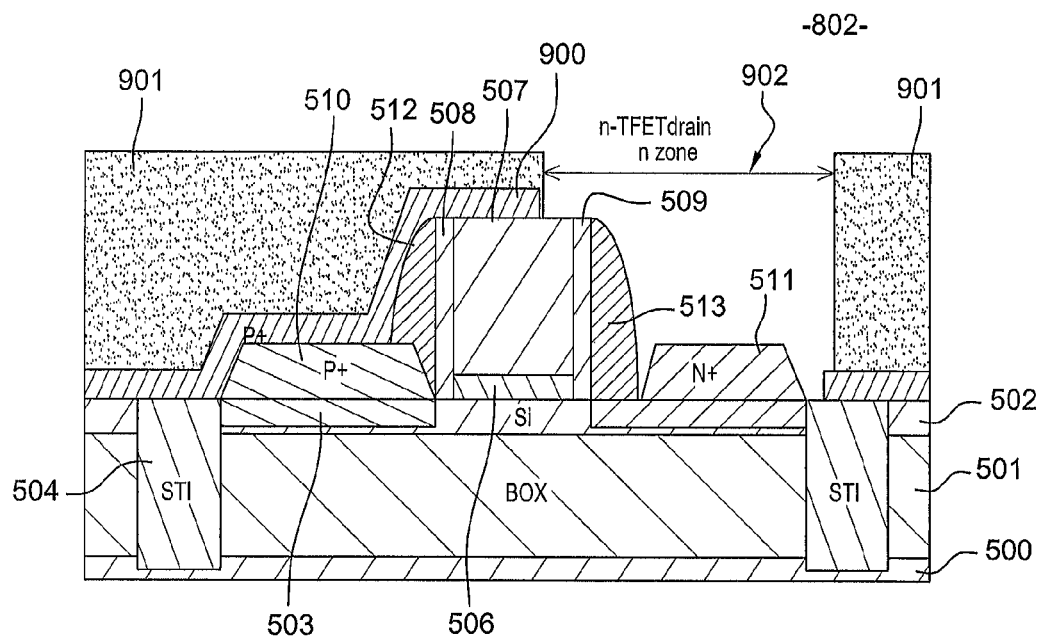

According to step 802 illustrated in FIG. 15c, the Ni-doping of the drain extension zone 511 is going to be carried out. This doping is carried out by firstly defining a resin casing 901 in which the zone 902 to be doped is opened (the opening is obtained by lithography and etching). The opened zone is n+ doped by ion implantation (for example an implantation by As or P ions) so as to obtain the doped drain extension zone 511. Once again, the fact of having beforehand formed the second spacer leads to an offset of the drain extension zone 511 making the device asymmetric: this asymmetry reduces the ambipolar character of the device as well as the current in the blocked state.

Figure 15D:
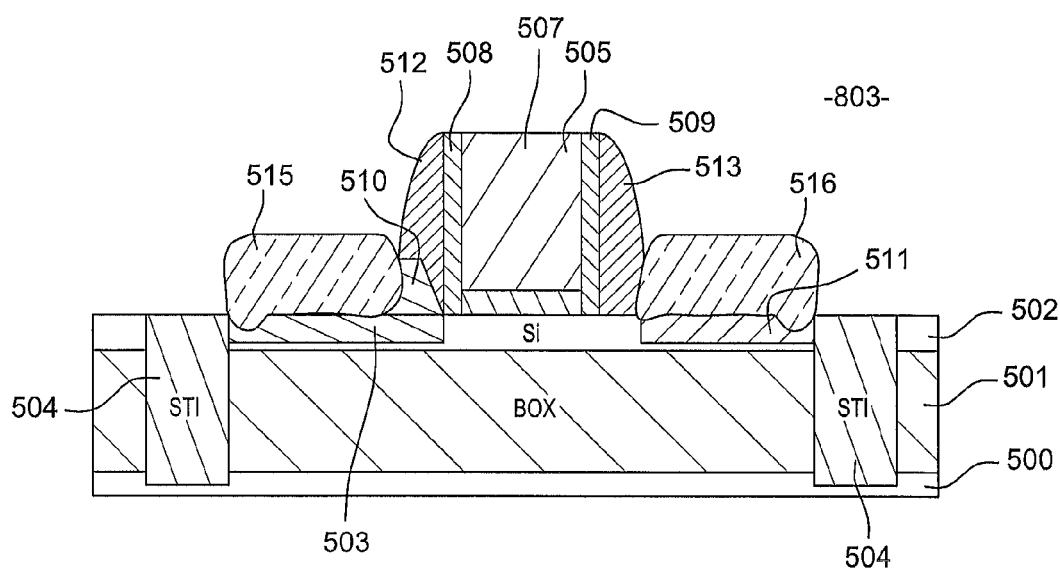

According to step 803 illustrated in FIG. 15d, the device according to the invention is finalised; to do this, the resin casing 901 and the hard mask 900 are removed by a "stripping" or "lift-off" type method. In order to activate the doping atoms and to mend defects due to the bombardment, an implantation annealing (also known as activation annealing) is then carried out. In order to minimise the resistance of the drain 511 and source 510 extension zones made of doped monocrystalline silicon, a step of silicidation of said zones 515 and 516 is also carried out; the silicidation corresponds to the metallisation of said zones.

The invention finds a particularly interesting application in the case of low power applications or low voltage electronics, for example in the case of the realisation of SRAM (Static Random Access Memory).

Obviously, the transistor according to the invention is not limited to the embodiments that have been described herein by way of indication and in no way limiting while referring to the figures.

Thus, even if the invention has been more particularly described in the case of an N-type tunnel effect transistor, it is understood that it applies as much to a P-type tunnel effect transistor by reversing the P and N doping of the source and drain semi-conductive regions.

Moreover, even if the different curves presented were obtained for double gate transistors, it is understood that similar results are obtained for a single gate transistor according to the invention.

The invention claimed is:

1. A tunnel field effect transistor comprising:
   a channel made of an intrinsic semi-conductor material;
   source and drain extension regions on either side of said channel, in contact with the intrinsic semi-conductor material of said channel, said source extension region being made of a semi-conductor material doped according to a first type of P or N doping and said drain extension region being made of a semi-conductor material doped according to a second type of doping opposite to said first type of doping;
   source and drain conductive regions respectively in contact with the source and drain extension regions and extending respectively above the source and drain extension regions;
   a gate structure surmounting said channel and laid out such that an end of said channel is not covered by the gate structure on the side of the source extension region, said gate structure comprising:
      a gate dielectric layer in contact with said channel;
      a gate zone above said gate dielectric layer such that said gate dielectric layer is arranged between said gate zone and said channel;
   a drain isolating arrangement for forming a drain isolating space between the respective sides of said gate structure and said drain conductive region opposite each other;
   a source isolating arrangement for forming a source isolating space between the respective sides of said gate structure and said source conductive region opposite each other, said source isolating arrangement comprising a first and a second dielectric spacer each having a first and a second lateral face;
   wherein said source extension region has a thickness strictly greater than that of the channel such that said source extension region has an increased thickness opposite said gate dielectric layer;
   wherein the first face of said first spacer is in contact with the side of said gate zone followed by the side of said gate dielectric layer such that said first face covers the whole of the side of said dielectric layer;
   wherein the second face of said first spacer is in contact with the first face of said second spacer and extends along the side of the increased thickness of the source extension region;
   wherein the first spacer covers the upper surface of the end of said channel not covered by the gate structure and has a length strictly below 5 nm, said length being measured along the longitudinal direction of said channel.

2. The transistor according to claim 1, wherein said first spacer is made of a low-k dielectric material and said gate dielectric layer is made of a high-k material.

3. The transistor according to claim 2, wherein said second spacer is made of a low-k dielectric material.

4. The transistor according to claim 1, wherein the length of said first spacer is comprised between 1 and 4 nm.

5. The transistor according to claim 4, wherein the length of said first spacer is comprised between 1 and 2 nm.

6. The transistor according to claim 1, wherein said increased thickness of said source extension region is substantially equal to the thickness of the gate dielectric layer.

7. The transistor according to claim 1, wherein said channel and said drain extension region have the same thickness.

8. The transistor according to claim 1, wherein said drain conductive region fully covers the drain extension region.

9. The transistor according to claim 1, wherein said means drain isolating arrangement for forming a drain isolating space between the respective sides of said gate structure and said drain conductive region opposite each other is in contact with said channel and extend above the end of said channel on the side of the drain extension region.

10. A tunnel field effect transistor comprising:
a channel made of an intrinsic semi-conductor material;
source and drain extension regions on either side of said channel, in contact with the intrinsic semi-conductor material of said channel, said source extension region being made of a semi-conductor material doped according to a first type of P or N doping and said drain extension region being made of a semi-conductor material doped according to a second type of doping opposite to said first type of doping;
source and drain conductive regions respectively in contact with the source and drain extension regions and extending respectively above the source and drain extension regions;
a gate structure over said channel and arranged such that an end of said channel is not covered by the gate structure on the side of the source extension region, said gate structure comprising:
a gate dielectric layer in contact with said channel;
a gate zone above said gate dielectric layer such that said gate dielectric layer is arranged between said gate zone and said channel;
a first spacer for forming a drain isolating region between the respective sides of said gate structure and said drain conductive region opposite each other;
a second spacer for forming a source isolating space between the respective sides of said gate structure and said source conductive region opposite each other, said second spacer comprising a first and a second dielectric spacer each having a first and a second lateral face;
wherein said source extension region has a thickness greater than that of the channel such that said source extension region has an increased thickness opposite said gate dielectric layer;
wherein the first face of said first dielectric spacer is in contact with the side of said gate zone followed by the side of said gate dielectric layer such that said first face covers the whole of the side of said dielectric layer;
wherein the second face of said first dielectric spacer is in contact with the first face of said second spacer and extends along the side of the increased thickness of the source extension region;
wherein the first dielectric spacer covers the upper surface of the end of said channel not covered by the gate structure and has a length below 5 nm, said length being measured along the longitudinal direction of said channel.

* * * * *